(12) United States Patent
Yamasaki et al.

(10) Patent No.: US 6,670,647 B1
(45) Date of Patent: Dec. 30, 2003

(54) SEMICONDUCTOR LIGHT EMITTING ELEMENT, DISPLAY DEVICE AND OPTICAL INFORMATION REPRODUCTION DEVICE USING THE SAME, AND FABRICATION METHOD OF SEMICONDUCTOR LIGHT EMITTING ELEMENT

(75) Inventors: Yukio Yamasaki, Tenri (JP); Shigetoshi Ito, Ikoma (JP)

(73) Assignee: Sharp Kabushiki Kaisha (JP)

( * ) Notice: Subject to any disclaimer, the term of this patent is extended or adjusted under 35 U.S.C. 154(b) by 61 days.

(21) Appl. No.: 09/652,101

(22) Filed: Aug. 30, 2000

(30) Foreign Application Priority Data

Aug. 31, 1999 (JP) .......................... 11-246791
Jun. 7, 2000 (JP) .......................... 2000-171342

(51) Int. Cl.[7] .................. H01L 29/06; H01L 33/00; H01L 29/12; H01L 29/20
(52) U.S. Cl. .................. 257/99; 257/101; 257/102; 257/103; 257/613; 257/615; 257/14; 257/627
(58) Field of Search .................. 257/99, 101, 102, 257/103, 615, 627, 14, 613

(56) References Cited

U.S. PATENT DOCUMENTS

| | | | | |
|---|---|---|---|---|
| 5,585,648 A | * | 12/1996 | Tischler | 257/77 |
| 5,751,013 A | * | 5/1998 | Kidoguchi et al. | 257/13 |
| 5,793,054 A | | 8/1998 | Nido | |
| 5,959,307 A | * | 9/1999 | Nakamura et al. | 257/14 |
| 6,072,197 A | * | 6/2000 | Horino et al. | 257/103 |
| 6,078,064 A | * | 6/2000 | Ming-Jiunn et al. | 257/103 |
| 6,285,696 B1 | * | 9/2001 | Bour et al. | 372/45 |

FOREIGN PATENT DOCUMENTS

| | | |
|---|---|---|
| JP | 9107149 | 4/1997 |
| JP | 9008412 | 10/1997 |
| JP | 10-135576 | 5/1998 |
| JP | 10-308531 | 11/1998 |
| JP | 11-186603 | 7/1999 |

OTHER PUBLICATIONS esp@cenet Database English Abstract of Japanese Application 9008412 (Oct. 1, 1997).
esp@cenet Database English Abstract of Japanese Application 9107149 (Apr. 22, 1997).
Kimura, Y. et al., (1998) "Room–temperature pulsed operation of GaN–based laser diodes on a –face sapphire substrate grown by low–pressure metalorganic chemical vapor deposition" *Jpn. J. Appl. Phys.*, 37:L1231–L1233.

* cited by examiner

*Primary Examiner*—George Eckert
*Assistant Examiner*—Joseph Nguyen
(74) *Attorney, Agent, or Firm*—Morrison & Foerster LLP

(57) ABSTRACT

A semiconductor light emitting element includes: a first conductive type layer made of a nitride semiconductor which is deposited on a substrate; a quantum well active layer made of $Al_P Ga_Q In_{1-P-Q} N$ ($0 \leq P$, $0 \leq Q$, $P+Q<1$) which is deposited on the first conductive type layer, the quantum well active layer including a pair of barrier layers and a well layer interposed therebetween; and a second conductive type layer made of a nitride semiconductor which is deposited on the quantum well active layer, wherein light spontaneously emitted from end faces of the quantum well active layer to polarized in a direction parallel to the substrate.

15 Claims, 16 Drawing Sheets

SEMICONDUCTOR LIGHT EMITTING ELEMENT, DISPLAY DEVICE AND OPTICAL INFORMATION REPRODUCTION DEVICE USING THE SAME, AND FABRICATION METHOD OF SEMICONDUCTOR LIGHT EMITTING ELEMENT

BACKGROUND OF THE INVENTION

1. Field of the Invention

The present invention relates to a semiconductor light emitting element such as a light emitting diode (LED) for use in a display device, a signaling device, etc., a semiconductor laser element, or the like, and a display device and an optical information reproduction apparatus using the same; and a method for fabricating such semiconductor light emitting elements. Specifically, the present invention relates to a nitride semiconductor light emitting element having a hexagonal crystal structure; a display device and an optical information reproduction apparatus using the same; and a method for fabricating such a semiconductor light emitting element.

2. Description of the Related Art

Representative nitride semiconductor materials such as GaN, AlN, InN, and mixed crystals thereof have realized semiconductor light emitting elements such as a light emitting diode (LED) capable of emitting light in a range from visible light to ultraviolet light. These semiconductor light emitting elements have been applied to a display device, a signaling device, etc.

For example, a semiconductor light emitting element using a nitride-gallium semiconductor material includes a layered structure in which a GaN buffer layer, an n-type GaN contact layer, an n-type InGaN quantum well active layer, a p-type AlGaN sublimation preventing layer, and a p-type GaN contact layer are sequentially provided on the (0001) face of a sapphire substrate.

The layered structure has a mesa structure formed by removing portions of the p-type GaN contact layer, the p-type AlGaN sublimation preventing layer, the n-type InGaN quantum well active layer, and the n-type GaN contact layer so that a portion of the n-type GaN contact layer is exposed and to substantially parallel to the substrate surface. On the exposed surface of the n-type GaN contact layer, a negative electrode it provided, while a transmissive positive electrode is provided over a substantially entire upper surface of the p-type GaN contact layer in the mesa structure. Furthermore, a positive electrode pad is provided on a predetermined portion of the transmissive positive electrode.

Light generated in the n-type InGaN quantum well active layer is output upward through the transmissive positive electrode and, on the other hand, is horizontally output from side surfaces of the mesa structure.

Alternatively, a semiconductor laser element using a nitride-gallium semiconductor material includes a layered structure in which a GaN buffer layer, an n-type GaN contact layer, an n-type AlGaN cladding layer, an n-type GaN light guiding layer, an n-type InGaN quantum well active layer, a p-type AlGaN sublimation preventing layer, a p-type GaN light guiding layer, a p-type AlGaN cladding layer, and a p-type GaN contact layer are sequentially provided on the (0001) face of a sapphire substrate.

The layered structure has a mesa structure formed by removing portions of the p-type GaN contact layer, the p-type AlGaN cladding layer, the p-type GaN light guiding layer, the p-type AlGaN sublimation preventing layer, the n-type InGaN quantum well active layer, the n-type GaN light guiding layer, the n-type AlGaN cladding layer, and the n-type GaN contact layer so that a portion of the n-type GaN contact layer is exposed and is substantially parallel to a substrate surface. On the p-type GaN contact layer, an insulating layer is provided so that a portion of the upper surface of the p-type GaN contact layer is exposed. This insulating layer also covers the substantially entire mesa structure except a side surface of the mesa structure from which light is emitted, and covers an electrode face of the n-type GaN contact layer so that a portion thereof is exposed. On an upper surface of the p-type GaN contact layer that is exposed through the opening of the insulating layer, a positive electrode is provided, while a negative electrode is provided on the upper surface of the n-type GaN contact layer that is exposed through the opening of the insulating layer.

In the above-described nitride semiconductor light emitting element (light emitting diode), since the polarization of light emitted from side surfaces of a mesa structure is not controlled, the emission efficiency of such a semiconductor light emitting element is deficient.

Furthermore, in the conventional semiconductor laser element, the polarization of spontaneous emission light from end faces of an active layer is not controlled, and accordingly, the noise characteristic of the semiconductor laser element is unsatisfactory. That is, in the conventional semiconductor laser element, since the coupling coefficient $\beta_{sp}$ of the spontaneous emission light to the laser oscillation mode is not controlled, the coherence length of the oscillated light is long, and when such a conventional element is used for a light source of an optical information reproduction apparatus for an optical disk or the like, the noise characteristic of the feedback induced noise may increase.

SUMMARY OF THE INVENTION

According to one aspect of the present invention, a semiconductor light emitting element includes: a first conductive type layer made of a nitride semiconductor which is deposited on a substrate, a quantum well active layer made of $Al_P Ga_Q In_{1-P-Q} N$ ($0 \leq P$, $0 \leq Q$, $P+Q<1$) which is deposited on the first conductive type layer, the quantum well active layer including a pair of barrier layers and a well layer interposed therebetween; and a second conductive type layer made of a nitride semiconductor which is deposited on the quantum well active layer, wherein spontaneous emission light from end faces of the quantum well active layer is polarized in a direction parallel to the substrate.

In one embodiment of the present inventions the well layer includes, in a mixed state, regions in which an In content is high and regions in which an in content is low; an average size of the regions in which an In content is high is 1 nm to 100 nm; and a density per unit area of the regions in which an In content is high to $1 \times 10^{11}/cm^2$.

In another embodiment of the present invention, the substrate is a sapphire substrate; and the first conductive type layer is deposited on a (0001) face of the sapphire substrate.

In still another embodiment of the present invention, the substrate is a sapphire substrate; and the first conductive type layer is deposited on a face tilted from a (0001) face of the sapphire substrate by an angle equal to or greater than 0.050 and smaller than 0.2°.

In still another embodiment of the present invention, the substrate is a GaN substrate; and the first conductive type layer is deposited on a (0001) face of the GaN substrate.

In still another embodiment of the present invention, the substrate is a GaN substrate; and the first conductive type layer is deposited on a face tilted from a (0001) face of the GaN substrate by an angle equal to or greater than 0.05° and smaller than 0.2°.

According to another aspect of the present invention, there to provided a display device using the semiconductor light emitting element of claim 1.

According to still another aspect of the present invention, there is provided an optical information reproduction device using the semiconductor light emitting element of claim 1.

According to still another aspect of the present invention, a method for fabricating the semiconductor light emitting element of claim 1 includes a step of growing crystal grains for the well layer, wherein either before or after the step of growing crystal grains for the well layer, the provision of III-group material is substantially stopped for 1 to 300 seconds.

In this specification, a quantum well and a quantum well active layer refer to a structure in which a semiconductor layer (well layer) having an average thickness of 20 nm or less is sandwiched with semiconductor layers (barrier layers) each having a bandgap larger than that of the well layer.

Furthermore, in this specification, regions within the quantum well active layer in which the in content is high (high InN mixed crystal ratio regions) refers to regions in which the in content is higher by 5% or more than the average content within any 24 nm×24 nm square plane in the well layer which is parallel to the substrate surface. On the other hand, regions within the quantum well active layer in which the In content is low (low InN mixed crystal ratio regions) refers to regions in which the in content is lower by 5% or more than the average content within any 24 nm×24 nm square plane in the well layer which is parallel to the substrate surface.

Furthermore, in the present specification, the thickness of the well layer in the quantum well active layer is represented by the average value of the thickness, for a 24 nm length along any direction parallel to the substrate surface within a certain cross-section of the well layer, which is perpendicular to the substrate surface. This average value is referred to as the average thickness of the well layer.

Thus, the invention described herein makes possible the advantages of (1) providing a semiconductor light emitting element having an improved light emission efficiency and satisfactory noise characteristics, and a fabrication method thereof; and (2) providing a display device and an optical information reproduction apparatus using such a semiconductor light emitting element.

These and other advantages of the present invention will become apparent to those skilled in the art upon reading and understanding the following detailed description with reference to the accompanying figures.

BRIEF DESCRIPTION OF THE DRAWINGS

FIG. 14B to a plan view showing a principal portion of the liquid crystal display device shown in FIG. 14A.

DESCRIPTION OF THE PREFERRED EMBODIMENTS

Embodiment 1

Figure 1A:
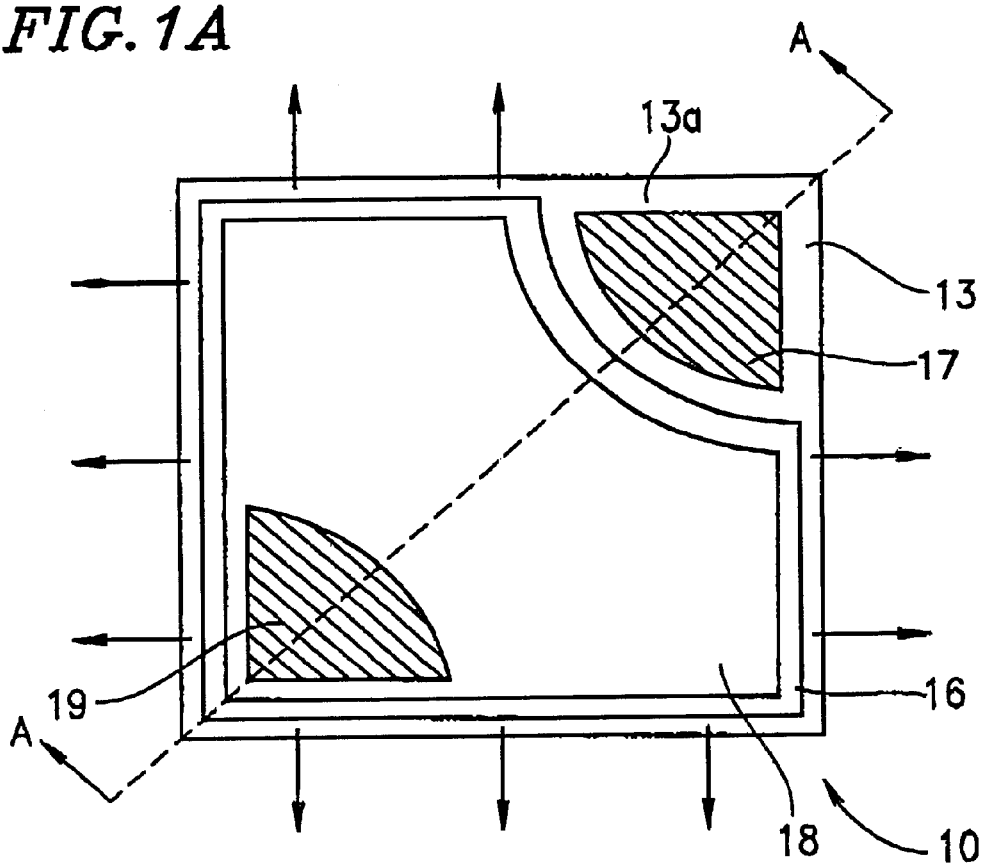
FIG. 1A is a plan view showing an exemplary embodiment of a semiconductor light emitting element according to the present invention.
Figure 1B:
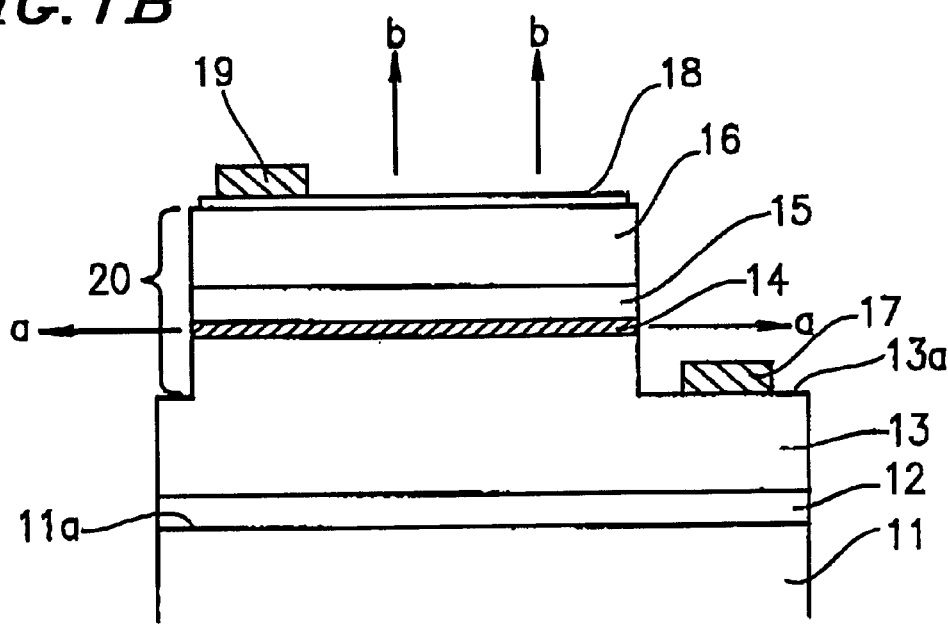
FIG. 1B is a schematic cross-sectional view taken along a line A—A of FIG. 1A.

Hereinafter, embodiments of the present invention will be described with reference to the drawings. FIG. 1A is a schematic plan view showing an exemplary embodiment of a semiconductor light emitting element according to the present invention. FIG. 1B is a schematic cross-sectional view taken along a line A—A of FIG. 1A. This semiconductor light emitting element is is a nitride semiconductor light emitting diode, and has a sapphire substrate 11, including a substrate surface 11a formed into a square each side of which has about several hundreds of micrometer length. The substrate surface 11a of the sapphire substrate 11 is the (0001) face or a face tilted with respect to the (0001) face by an angle in the range from 0.05° to smaller than 0.2°.

Over the entire substrate surface 11a of the sapphire substrate 11, a GaN buffer layer 12 is provided, and an n-type GaN contact layer 13 is provided over the GaN buffer layer 12. The n-type GaN contact layer 13 entirely covers the upper surface of the GaN buffer layer 12. The periphery of the n-type GaN contact layer 13 is removed from the upper surface to an intermediate position so as to form a step in the periphery of the n-type GaN contact layer 13 which to parallel to the substrate surface 11a an shown in FIG. 1A. Furthermore, one corner of the n-type GaN contact layer 13 is removed in the shape of a fan so as to form a fan-shaped electrode face 13a parallel to the entire substrate surface 11a of the sapphire substrate 11 as shown in FIGS. 1A and 1B.

On the fan-shaped electrode face 13a of the n-type GaN contact layer 13, a negative electrode 17 is provided. The negative electrode 17 has the shape of a fan similar to the shape of the fan-shaped electrode face 13a.

As shown in FIG. 1B, an n-type InGaN quantum well active layer 14 is provided entirely over a portion of the n-type GaN contact layer 13 which to left unremoved. The n-type InGaN quantum well active layer 14 includes an $In_xGa_{1-x}N$ barrier layer ($0<x<1$), an $In_yGa_{1-y}N$ well layer ($0<y<1$), and an $In_xGa_{1-z}N$ barrier layer ($0<z<1$) sequentially deposited in this order (see FIG. 17). In the quantum well active layer 14, the well layer includes regions in which the InN content is high (high InN mixed crystal ratio regions) and regions in which the content of InN is low (low InN mixed crystal ratio regions) in a plane of the well layer substantially parallel to the substrate surface 11a of the sapphire substrate 11. The size (diameter) of the high InN mixed crystal ratio regions is 1 nm to 100 nm. The density of the high InN mixed crystal ratio regions in the above plane is $1\times10^{11}/cm^2$ or more.

Over the entire upper surface of the quantum well active layer 14, a p-type AlGaN sublimation preventing layer 15 is provided for preventing the sublimation of In. Furthermore, a p-type GaN contact layer 16 is provided over the entire upper surface of the p-type AlGaN sublimation preventing layer 15. Moreover, a transmissive positive electrode 18 is provided over the substantially entire surface of the p-type GaN contact layer 16.

On the transmissive positive electrode 18, a positive electrode pad 19 is provided. As shown in FIG. 1A, the positive electrode pad 19 has the shape of flat fan inversive to the shape of the negative electrode 17 and positioned on the opposite corner to the negative electrode 17.

In one example of such a semiconductor light emitting element, for example, a GaN buffer layer 12 (thickness: about 20 nm) is provided on a substrate surface 11a ((0001) face) of a sapphire substrate 11 (about 400 $\mu$m×400 $\mu$m), and an n-type GaN contact layer 13 (thickness: about 4 $\mu$m) having an electrode face 13a is provided on the GaN buffer layer 12. Furthermore, provided on the n-type GaN contact layer 13 is an n-type InGaN quantum well active layer 14 sequentially including an $In_{0.05}Ga_{0.95}N$ barrier layer (thickness: about 5 nm), an $In_{0.2}Ga_{0.8}N$ well layer (thickness: about 3 nm on average), and an $In_{0.05}Ga_{0.95}N$ barrier layer (thickness: 5 nm). On the quantum well active layer 14, a p-type AlGaN sublimation preventing layer 15 (thickness: about 30 nm) and a p-type GaN contact layer 16 (thickness: about 0.5 $\mu$m) are sequentially provided. Furthermore, a negative electrode 17 is provided on the electrode face 13a of the contact layer 13, a transmissive positive electrode 18 is provided on the contact layer 16, and a positive electrode pad 19 is provided on the transmissive positive electrode 18.

Such a semiconductor light emitting element is fabricated by the metal-organic chemical vapor deposition (MOCVD) method as described below. First, a sapphire substrate 11 it washed and installed in a crystal growing apparatus. The sapphire substrate 11 to thermally treated for 10 minutes in an $H_2O$ gas atmosphere of about 1100° C. Then, the temperature of the atmosphere is decreased to about 500° C. to 600° C. After the decreased temperature has become stable, nitrogen gas is supplied as carrier gas such that the total flow rate of nitrogen gas (carrier gas) is set to 10 /min, and thereby a flow rate of ammonia gas is Bet to about 3 /min. Then, after a few seconds, trimethyl gallium (TMG) is supplied for one minute at a flow rate of about 20 $\mu$mol/min so as to deposit a GaN buffer layer 12 to a thickness of about 20 nm under the decreased temperature condition.

Thereafter, the provision of TMG is stopped, and the temperature is increased to 1050° C. Then, both TMG is supplied again at a flow rate of about 50 $\mu$mol/min, and $SiH_4$ gas is supplied at a flow rate of about 10 nmol/min, so that an n-type GaN contact layer 13 is grown to a thickness of about 4 $\mu$m.

Figure 2:
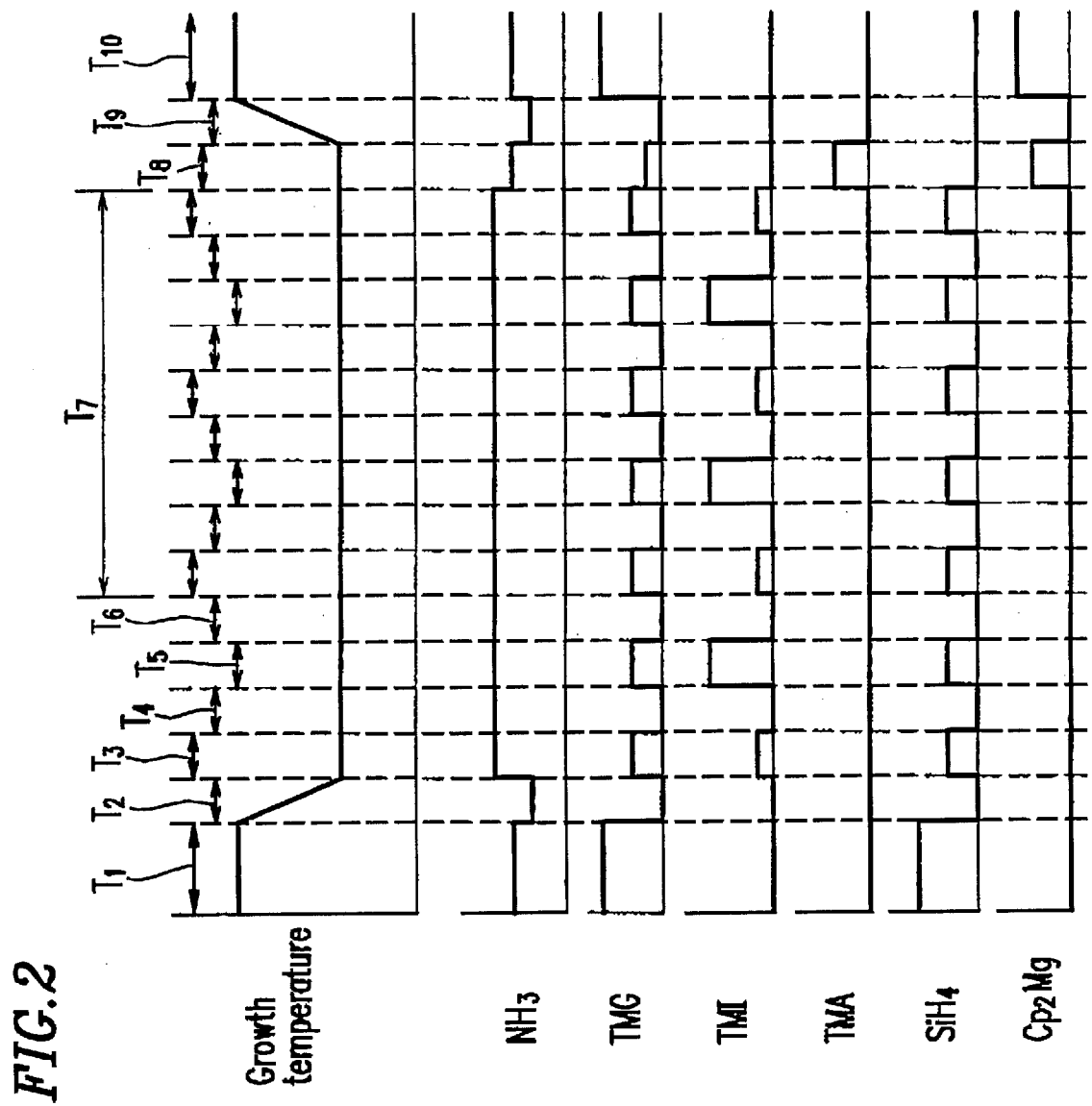
FIG. 2 is a time chart for providing materials in the fabrication of the semiconductor light emitting element according to the present invention.

Thereafter, material gases, i.e., $NH_3$ gas, TMG, trimethyl indium (TMI), trimethyl aluminum (TMA), $SiH_4$ gas, $Cp_2Mg$ ($(C_5H_5)_2Mg$: bis-cyclopenta-dienyl-magnesium) gas, are respectively Supplied based on the time chart of FIG. 2, whereby an n-type InGaN quantum well active layer 14 is grown on the n-type GaN contact layer 13. That is, after the n-type GaN contact layer 13 has been grown (see period $T_1$), the provision of the $SiH_4$ gas and TMG is stopped while the provision of the $NH_3$ gas continues, and the temperature of the substrate 11 in decreased to, for example, about 650–850° C., whereby the quantum well active layer 14 starts to grow (period $T_2$).

The growth temperature of the quantum well active layer 14 is one of the parameters that determine the emission wavelength of a semiconductor light emitting element to be produced. As the growth temperature becomes lower, the emission wavelength becomes longer. In the case where the temperature of the substrate 11 is in the range of 650° C. to 860° C., the produced semiconductor light emitting element emits light in the wavelength range from purple to green. Thus, the temperature of the substrate 11 may be changed in order to produce a semiconductor light emitting element that emits light in the wavelength range of another color.

Then, after the temperature of the substrate 11 has become stable, the quantity of the $NH_3$ gas to be supplied is increased, and both TMG and TMI are supplied at a flow rate of 10 μmol/min, whereby an $In_{0.05}Ga_{0.95}N$ barrier layer is grown so as to have a thickness of about 5 nm on average (period $T_3$).

After the barrier layer has been grown, the provision of TMG and TMI is stopped while the provision of the carrier gas and the $NH_3$ gas continues, and the provision of III-group material gasses, such as TGM, TMI, and TMA, is substantially stopped for 1 to 300 seconds, thereby suspending the growth of crystal grains (period $T_4$).

After the suspension period, TMG la supplied at a flow rate of 10 μmol/min and TMI is supplied at a flow rate of 50 μmol/min, whereby an $In_{0.2}Ga_{0.8}N$ well layer is grown so as to have a thickness of about 3 nm on average (period $T_5$). After the well layer has been grown, the provision of TMG and TMI is stopped again while the provision of the carrier gas and the $NH_3$ gas continues, and the provision of III-group material gasses is substantially stopped for 1 to 300 seconds, thereby suspending the growth of crystal grains (period $T_6$). Thereafter, the provision of TMG and TMX is resumed at a flow rate of 10 μmol/min for each of these materials, whereby an $In_{0.05}Ga_{0.95}N$ barrier layer is formed so as to have a thickness of about 5 nm.

As described above, the quantum well active layer 14 in which the well layer is sandwiched by the pair of barrier layers has been formed. As occasion demands, the growth of the barrier layers and the well layer may be repeated several times so as to form a plurality of well layers. Period $T_7$ of FIG. 2 is a time chart for the case of forming a plurality of well layers. In the case where the growth of crystal grains is suspended before and after the formation of the plurality of well layers, it is found that a quantum well active layer 14 having two to ten well layers emits light most efficiently. Furthermore, in the growth of the quantum well active layer 14, $SiH_4$ gas may be supplied at a flow rate of about 10 nmol/min so as to add Si to the well layer and/or the barrier layers.

After one or a plurality of well layers have been formed, TMG is supplied at a flow rate of 10 μmol/min and TMA is supplied at a flow rate of 5 mol/min, along with the provision of $Cp_2Mg$ gas (period $T_8$). As a result, a p-type AlGaN sublimation preventing layer 15 to formed so as to have a thickness of about 30 nm.

Then, the provision of TMG, TMI, and $Cp_2Mg$ gas is stopped while the provision of the $NH_3$ gas continues, and the temperature of the substrate 11 is increased again to 1050° C. (period $T_9$). After the temperature of the substrate 11 is increased to the predetermined temperature, TMG is supplied at a flow rate of 50 μmol/min, and the $Cp_2Mg$ gas is supplied, so that a p-type GaN contact layer 16 is grown so an to have a thickness of about 0.5 μm (period $T_{10}$). Thereafter, the provision of TMG and the $Cp_2Mg$ gas is stopped, and the heating of the substrate 11 is terminated.

After the semiconductor layers has been deposited by the MOCVD method, the periphery of the resultant semiconductor layered structure is removed by the photolithography technique and the reactive ion etching technique vertically from the upper surface of the p-type GaN contact layer 16 to an intermediate position of the n-type GaN contact layer 13, and one corner of the resultant semiconductor layered structure is removed in a predetermined shape so that a portion of the n-type GaN contact layer 13 is exposed (electrode section 13*a*), resulting in the mesa structure 20 having a quantum well active layer 14 as shown in FIGS. 1A and 1B.

Thereafter, a negative electrode 17, formed of Al/Ti, Au/W, or the like, is mounted on the electrode section 13*a* of the n-type GaN contact layer 13. On the other hand, a transmissive positive electrode 18, formed of Au/Ni, Au/Pd, or the like, is mounted on the p-type GaN contact layer 16. Then, a positive electrode pad 19 formed of, e.g., Au is mounted on a corner on the transmissive positive electrode 18 opposite to the corner in which the negative electrode 17 is provided.

The sapphire substrate 11 in typically prepared in the form of a wafer. After the semiconduator layers have been formed on the wafer by the MOCVD method and the etching process has been performed, the wafer is divided into square chips (400 μm×400 μm), thereby obtaining the semiconductor light emitting element 10 as shown in FIGS. 1A and 1B.

Figure 17:
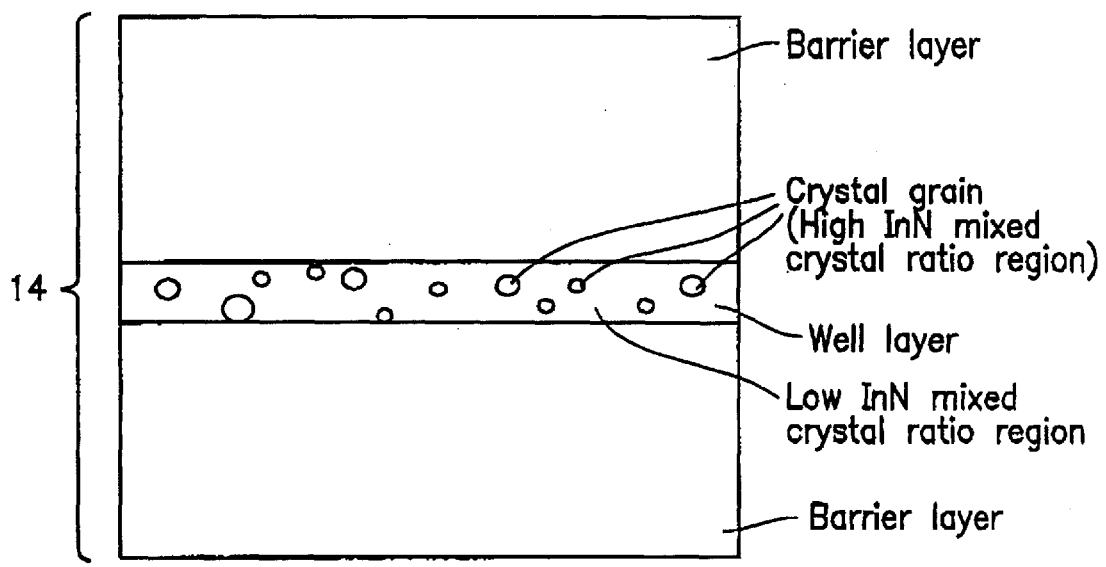
FIG. 17 schematically generally shows a cross-sectional TEM image of the quantum well active layer 14.

An portion of the layered structure of thus-produced semiconductor light emitting element was cut away to prepare a sample in the shape of a thin strip for observation of the crystal structure in the quantum well active layer 14 by the transmission electron microscope (TEM). Then, a cross-sectional TEM image of the quantum well active layer 14 was obtained at an acceleration voltage of 200 kilovolts (kV) using a commonly-employed transmission electron microscope. FIG. 17 schematically generally shows the obtained cross-sectional TEM image of the quantum well active layer 14. From the TEM images, it was found that generally spherical crystal grains of high InN mixed crystal ratio, each having a diameter of about 2 nm, were distributed substantially uniformly in the well layer.

The total number of crystal grains found in the quantum well active layer 14 of the obtained cross-sectional TEM Image was counted. The number of crystal grains in a cross-sectional TEM image on the (0100) face is about 5 in the image area of 24 nm width and about 3 nm height (corresponding to the thickness of the well layer). On the other hand, in a cross-sectional TEM image on the (1000) face, about 4–5 crystal grains were found in an image area of the same size.

Furthermore, from TEM images obtained in different regions, the average number of crystal grains in a certain area was calculated. The number of crystal grains in a square area of $5.8 \times 10^{-12}$ cm$^{-2}$ (24 nm×24 nm) was 23 on average. Converting this into the total number of crystal grains in a unit area (1 cm$^2$), the number of crystal grains is $4.0 \times 10^{12}$ cm$^{-2}$. On the other hand, the average distance between the centers of adjacent crystal grains was about 4.8 nm. Assuming that one crystal grain is present in a square of 4.8 nm×4.8 nm (the average distance between the centers of adjacent crystal grains), i.e., in a square area of $2.3 \times 10^{-13}$ cm$^2$, the total number of crystal grains in the unit area (1 cm$^2$) is calculated to $4.3 \times 10^{12}$ cm$^{-2}$, which is substantially equal to the above converted value, $4.0 \times 10^{12}$ cm$^{-2}$.

The above thin strip sample was observed by a commonly-employed analytical electron microscope to analyze the crystal structure inside the quantum well active layer 14. The result of EPMA (electron-probe microanalysis) demonstrated that a larger quantity of indium was contained in crystal grains than in other regions, i.e., greater than in the major region. Even from the major region, a signal which was assumed as being caused by a characteristic X-ray of indium was received. However, the concentration of indium was lower than the average In composition of the well layer by 5% or more. On the other hand, the concentration of indium contained in crystal grains was higher than the average in composition of the well layer by 5% or more. The maximum of the detected concentration values was higher by 10% or more. One result was obtained which teaches that, judging from the intensity of the detected kα characteristic X-ray of indium, the indium concentration may be different among crystal grains on the order of a small percentage difference. However, the detection performance of the EPMA analysts apparatus was not able to measure precisely such a difference in concentration. Furthermore, in the interface areas between crystal grains and a major region therearound, there were regions in which the arrangement of crystal lattices had been corrupted, which is thought to be caused by distortion or the like. These crystal grains correspond to the high InN mixed crystal ratio regions described in the this specification, and are observed as bright spots by an optical microscope.

In such a semiconductor light emitting element, the mesa 20 includes the upper portion of the n-type GaN contact layer 13, the n-type InGaN quantum well active layer 14, the p-type AlGaN sublimation preventing layer 15, the p-type GaN contact layer 16, and the transmissive positive electrode 18. Current flow between the positive electrode 18 and the negative electrode 17 allows the n-type InGaN quantum well active layer 14 to generate light. Large components of the generated light travel substantially in parallel to the substrate surface 11a of the sapphire substrate 11, and exits from the side surfaces of the mesa 20 as shown by arrows in FIG. 1A and arrows a of FIG. 1B.

In this case, the n-type InGaN quantum well active layer 14 includes regions in which the content of InN is high (high InN mixed crystal ratio regions) and regions in which the content of InN is low (low InN mixed crystal ratio regions). Therefore, light polarized in a direction parallel to the substrate surface 11a is emitted from the side surfaces of the mesa 20.

Furthermore, other components of the light generated in the quantum well active layer 14 travel in a direction substantially perpendicular to the substrate surface 11a of the sapphire substrate 11, and exits upward through the transmissive electrode 18 as shown by arrows b in FIG. 1B.

In the semiconductor light emitting element 10 shown in FIGS. 1A and 1B, when the semiconductor light emitting element 10 was emitting light, the state of emission (emission pattern) was observed by an optical microscope in a direction perpendicular to the substrate surface 11a from the semiconductor growth face side. Then, the observed image was subjected to the image analysis process to examine the in-plane distribution of the emission intensity. As a result, bright spots whose diameter is equal to or smaller than the resolution (100 nm or smaller) were found at the density of $1 \times 10^{11}/cm^2$ or more. These bright spots are recognized as corresponding to the above described crystal grains.

Figure 15:
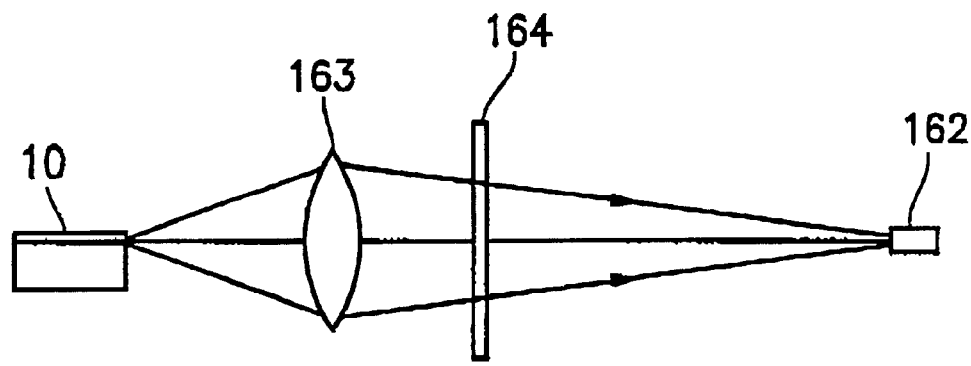
FIG. 15 shows an optical system for examining the polarization direction of light spontaneously emitted from end faces of a quantum well active layer of the semiconductor light emitting element.

FIG. 15 shows an optical system for examining the polarization direction of light spontaneously emitted from the end face of the quantum well active layer 14 of the semiconductor light emitting element 10 fabricated according to the present invention. In this optical system, the light emitted from the end face of the quantum well active layer 14 of the semiconductor light emitting element 10 is transmitted through a lens 163 and converged in a photodetector 162. As the lens 163, a microscope objective lens with a magnifying power of 10–100 times, for example, UM-Plan FI (100x, 0.90 BD P, obtained from Olympus Optical Co., Ltd.) is used. A polarizer 164 is inserted between the lens 163 and the photodetector 162. The polarizer 164 can be rotated on an optical axis.

In such an optical system, assume that P1 is the intensity of light detected by the photodetector 162 in the case where the polarizer 164 is fixed so that the direction of the transmission axis of the polarizer 164 is parallel to the substrate surface of the semiconductor light emitting element 10, and P2 is the intensity of light detected by the photodetector 162 in the case where the polarizer 164 is fixed so that the direction of the transmission axis of the polarizer 164 is perpendicular to the substrate surface of the semiconductor light emitting element 10. In this case, P1/P2 is defined as the polarization ratio.

When this polarization ratio is greater than 1, light spontaneously emitted from end faces of the quantum well active layer 14 is polarized in a direction substantially parallel to the substrate surface. On the other hand, when a polarization ratio is smaller than 1, light spontaneously emitted from end faces of the quantum well active layer 14 is polarized in a direction substantially perpendicular to the substrate surface.

As already described, light emitted from the side surfaces of the mesa 20 is polarized in a direction parallel to the substrate surface 11a because the n-type InGaN quantum well active layer 14 includes the high InN mixed crystal ratio regions and the low InN mixed crystal ratio regions. Such a difference in the content of InN is caused by the suspension periods of the crystal growth for 1 to 300 seconds before and after the crystal growth for forming the well layer in the quantum well active layer 14. Especially, it is preferable that the suspension period of the crystal growth is set to 5–200 seconds, more preferably, 10 to 80 seconds.

In the case where the suspension period of the crystal growth was set to 5–200 seconds, the polarization ratio of light emitted from the side surfaces of the mesa 20 was higher than 10, and the external quantum efficiency was 8% or more. In the case where the suspension period of the crystal growth was set to 10 to 80 seconds, the polarization ratio of light emitted from the side surfaces of the mesa 20 was 15 or higher, the external quantum efficiency was 8.5% or more, and the peak wavelength of the emission spectrum was 470 nm.

Figure 3:
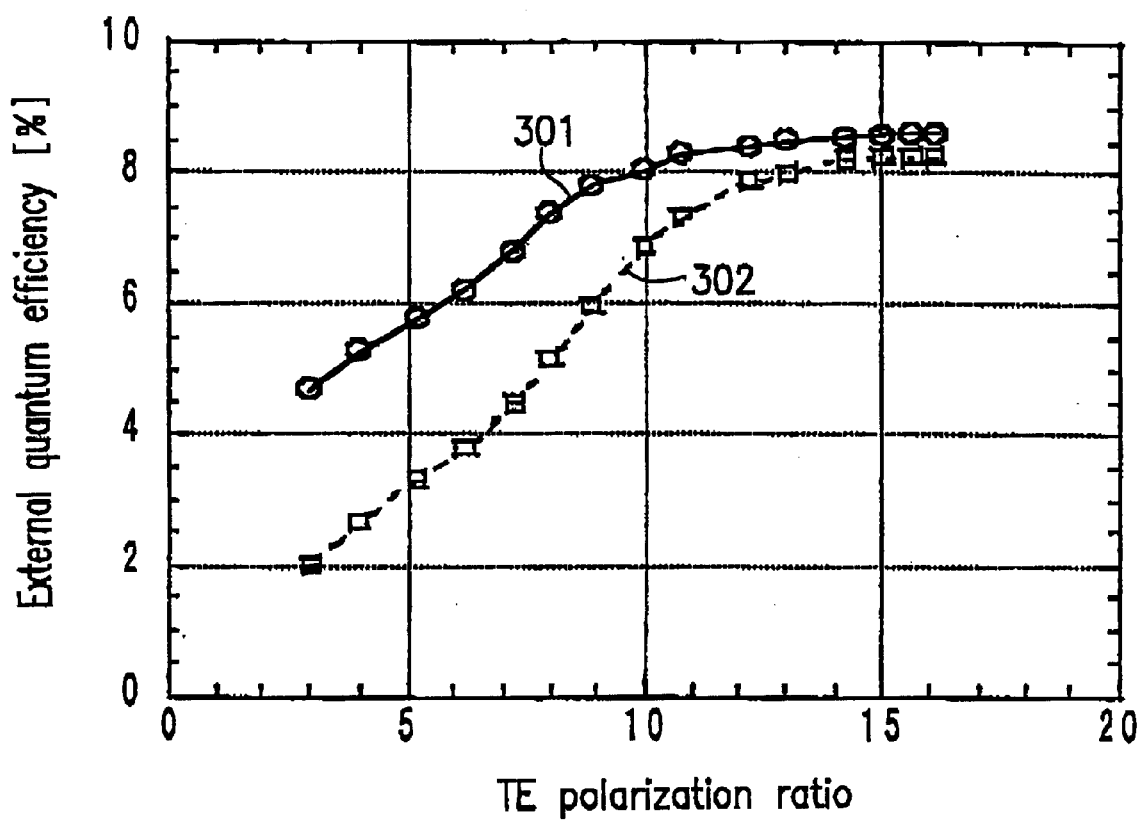
FIG. 3 shows the external quantum efficiency (%) of the semiconductor light emitting element 10 shown in FIGS. 1A and 1B for light emitted from aide surfaces of the mesa of the element 10 against the ratio between, the intensity of light polarized in a direction substantially perpendicular to the substrate surface and the intensity of light polarized in a direction substantially parallel to the substrate surface (TE polarization ratio).

Now, consider the characteristics of light emitted from the side surfaces of the mesa 20 of the semiconductor light emitting element shown in FIGS. 1A and 1B. In the graph of FIG. 3, a solid line 301 represents the external quantum efficiency (%) of the semiconductor light emitting element with respect to a ratio between the intensity of light polarized in a direction substantially parallel to the substrate surface 11a and the intensity of light polarized in a direction substantially perpendicular to the substrate surface 11a (TE polarization ratio), This graph plots the external quantum efficiency with respect to the TE polarization ratio of each of the semiconductor light emitting elements which have been produced with different suspension periods of the crystal growth before and after the crystal growth for forming the well layer of the quantum well active layer 14. The characteristic represented by the solid line 301 were also seen in a semiconductor light emitting element in which the peak of the wavelength of the emission spectrum was in the range of 390 nm to 530 nm.

In the graph of FIG. 3, as the polarization ratio of light emitted from the side surfaces of the mesa 20 of the semiconductor light emitting element becomes higher, the external quantum efficiency increases. The reason for that is not clear, but can be supposed as below, although the inventors do not wish the invention to be limited by theory.

In general, the transmissive positive electrode 18 absorbs light. Thus, in order to improve the emission efficiency (external quantum efficiency) of the semiconductor light emitting element, it is desirable to reduce the quantity of light emitted from the upper surface of the mesa 20 and to increase the quantity of light emitted from the side surfaces of the mesa 20.

In the case where light generated in the quantum well active layer 14 is polarized in a direction substantially parallel to the substrate surface 11a (i.e., the TE polarization ratio is greater than 1), the quantity of p-polarized components of light emitted from the upper surface of the mesa 20 (components parallel to a plane including an incident light direction and a reflected light direction) to small as compared to the case where no polarization is caused (i.e., the TE polarization ratio is 1). In general, p-polarized components have a greater transmissivity through the interface as compared to s-polarized components (components perpendicular to a plane including an incident light direction and a reflected light direction). Therefore, reducing the p-polarized components suppresses the transmission of light through the upper surface of the mesa 20, and the quantity of light emitted from the side surfaces of the mesa 20 increases.

According to the above principle, the emission efficiency (external quantum efficiency) of the semiconductor light emitting element improves in the case where light generated in the quantum well active layer 14 is polarized in a direction parallel to the substrate surface 11a.

On the other hand, the internal quantum efficiency does not vary much even in the case of changing the suspension time of the crystal growth before and after the crystal growth for forming the well layer of the quantum well active layer 14. It is considered that the variation of the internal quantum efficiency is limited to 10% or less, while the external quantum efficiency widely changes according to the variation of the suspension period of the crystal growth. As a result, it is presumed that when light generated in the quantum well active layer 14 is polarized in a direction parallel to the substrate surface 11a, the emission efficiency improves, thereby obtaining the characteristic as shown in the graph of FIG. 3.

The graph of FIG. 3 shows that as the polarization ratio of light emitted from the side surfaces of the mesa 20 of the semiconductor light emitting element becomes higher, the external quantum efficiency of the semiconductor light emitting element improves. For the purpose of improving the external quantum efficiency of the semiconductor light emitting element, it is desirable that the polarization ratio be greater than 5, more preferably greater than 10, and still more preferably, greater than 15.

Figure 4:
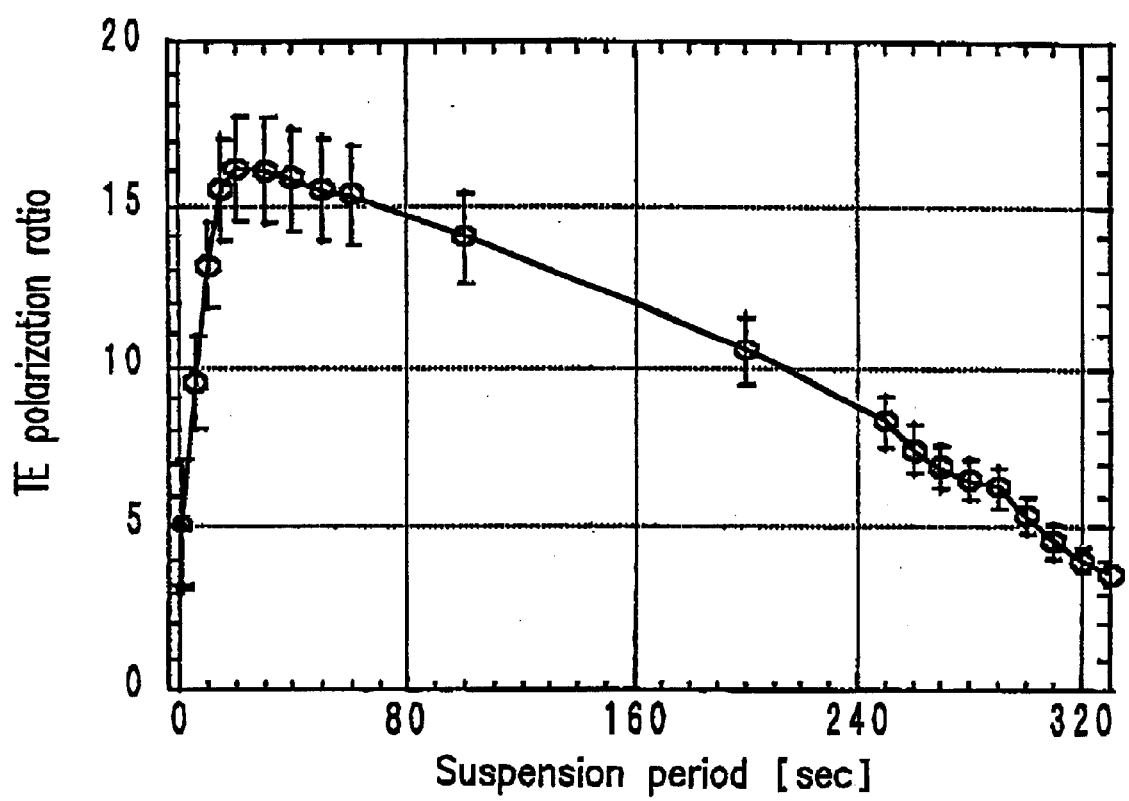
FIG. 4 shows the relationship between the TE polarization ratio of light emitted from side surfaces of the mesa of the semiconductor light emitting element and the suspension period of the crystal growth immediately after the crystal growth for forming the lowermost barrier layer in the quantum well active layer of the semiconductor light emitting element 10 shown in FIG. 1A and 1B.

The graph of FIG. 4 shows the relationship between the suspension period of the crystal growth immediately after the crystal growth for forming the lowermost barrier layer in the quantum well active layer 14 of the semiconductor light emitting element 10 shown in FIGS. 1A and 1B and the TE polarization ratio of light emitted from the side surfaces of the mesa 20 of the semiconductor light emitting element 10. Immediately after the crystal growth for forming the lowermost barrier layer in the quantum well active layer 14, the crystal growth is suspended for one second or longer, whereby the density of the high InN mixed crystal ratio regions in a subsequent well layer can be $1 \times 10^{11}/cm^2$ or more. As a result, the polarization ratio of light emitted from the side surfaces of the mesa 20 of the semiconductor light emitting element 10 can be increased, and the emission efficiency of the semiconductor light emitting element 10 thus significantly improves.

In the case where the suspension period of the crystal growth provided immediately after the crystal growth for forming the lowermost barrier layer in the active layer 14 reaches 300 seconds or more, the polarization ratio of light emitted from the side surfaces of the mesa 20 decreases. The reason for this is not clear, but can be supposed as below, although the inventors do not wish the invention to be limited by theory. In the case where the suspension period of the crystal growth provided immediately after the crystal growth for forming the lowermost barrier layer in the active layer reaches 300 seconds or more, the phase separation is facilitated in a well layer to be subsequently formed, the size of the high InN mixed-crystal ratio region decreases, and the content of InN in that region increases, accordingly. As a result, in the active layer 14, the carrier density increases in the high InN mixed crystal ratio regions, and therefore, the undesirable overlapping of the injected carrier density distributions between adjacent high InN mixed crystal ratio regions disappears. Accordingly, the injected carrier behaves as if it were confined inside a quantum box, and the polarization ratio decreases.

As seen from the graph of FIG. 4, the suspension period of the crystal growth immediately after the crystal growth for forming the lowermost barrier layer is set to 1 to 300 seconds. Preferably, it is set to 5 to 200 seconds, and more preferably, to 10 to 80 seconds.

As shown in the graph of FIG. 4, the TE polarization ratio of light emitted from the side surfaces of the mesa 20 of the semiconductor light emitting element depends on the suspension period of the crystal growth provided immediately after the crystal growth for forming the lowermost barrier layer in the active layer 14. On the other hand, it is confirmed that the TE polarization ratio of light emitted from the side surfaces of the mesa 20 of the semiconductor light emitting element also depends substantially in a similar manner on the suspension period of the crystal growth provided immediately after the crystal growth for forming the well layer in the active layer 14. Furthermore, also in the case where the multiple quantum well layer including a plurality of well layers is provided, the TE polarization ratio depends substantially in a similar manner on the suspension period of the crystal growth provided before and after the crystal growth for forming each well layer.

Figure 5:
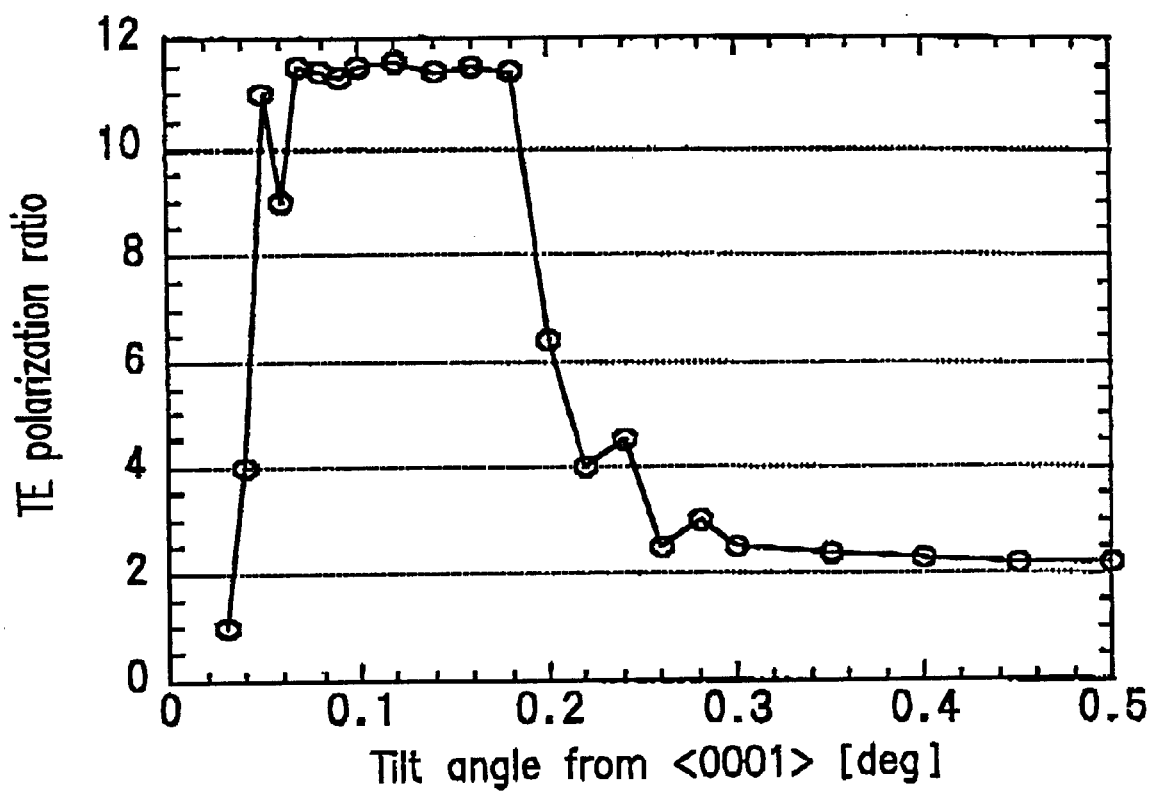
FIG. 5 shows the relationship between the tilt angle of the substrate surface of the sapphire substrate and the TE polarization ratio of light emitted from side surfaces of the mesa of the semiconductor light emitting elements fabricated using various sapphire substrates having different tilt angles so as to have a structure as shown in FIGS. 1A and 1B.

The present inventors produced semiconductor light emitting elements using sapphire substrates having various tilt angles so that each semiconductor light emitting element has a structure as shown in FIGS. 1A and 1B. The graph of FIG. 5 shows the relationship between the TE polarization-ratio of light emitted from the side surfaces of the mesa 20 and the tilt angle of the substrate surface 11a of the sapphire substrate 11. This graph to a characteristic curve in the case where the substrate surface of the sapphire substrate 11 is tilted in the <11–20> direction.

As seen from the graph of FIG. 5, when the tilt angle of the substrate surface of the sapphire substrate 11 is 0.05° or greater and is smaller than 0.2°, the desirable TE polarization ratio is obtained. Furthermore, no matter which direction the substrate surface is tilted in from the <0001> direction, the desirable TE polarization ratio is obtained. This is because a semiconductor layer is deposited on a sapphire substrate 11 in which the crystal orientation has been slightly tilted from the <0001> direction, whereby the surface state of the underlying layer under the active layer 14 changes, and the size and density of the high InN mixed crystal ratio regions thus can be easily controlled.

Figure 6:
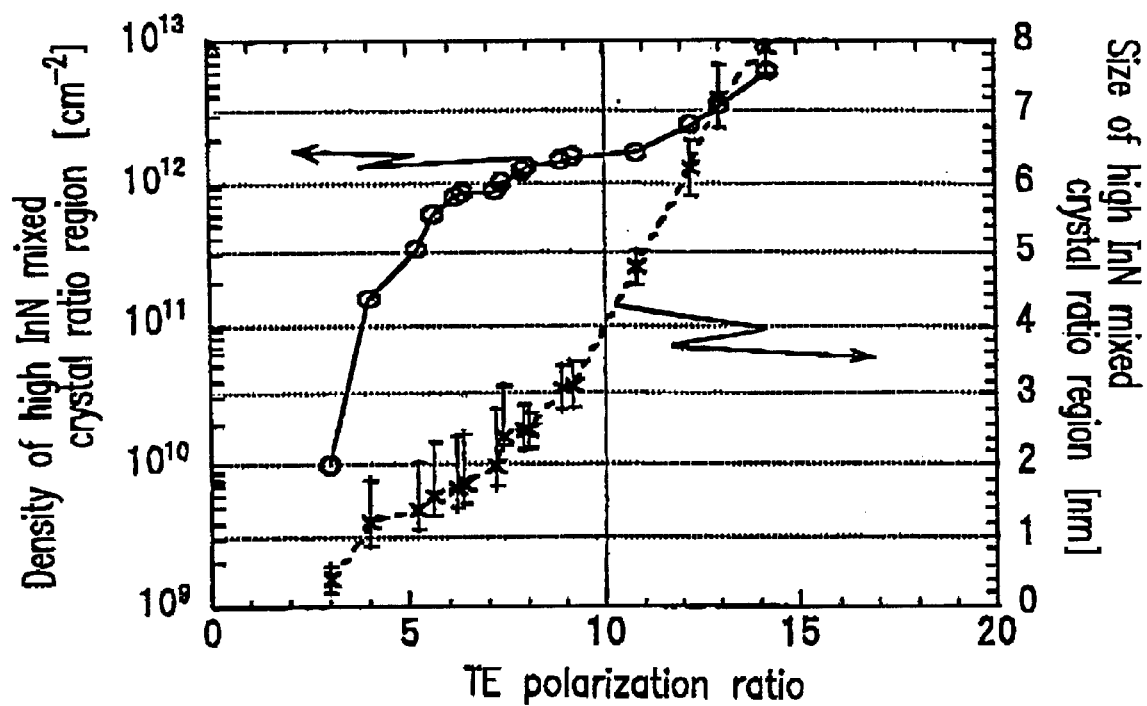
FIG. 6 shows the relationship of the TE polarization ratio of light emitted from side surfaces of the mesa of the semiconductor light emitting element shown in FIGS. 1A and 1B against the in-plane density and the size of high InN mixed crystal ratio regions in a well layer of a single quantum well active layer.

FIG. 6 shows the relationship between the TE polarization ratio of light emitted from the side surfaces of the mesa 20 in the semiconductor light emitting element as shown in FIGS. 1A and 1B and the in-plane density of high InN mixed crystal ratio regions in a well layer of a single quantum well active layer 14. FIG. 6 also shows the relationship between the TE polarization ratio and the size of high InN mixed crystal ratio regions in the well layer.

As seen from the graph of FIG. 6, as the TE polarization ratio increases, the density of the high InN mixed crystal ratio regions increases to $1.0 \times 10^{11}/cm^2$ or more, and the size of the high InN mixed crystal ratio regions increases to 1 nm. The reason for that is not clear, but can be supposed as below although not wishing to be limited by theory. When the current is injected, the density of injected carrier is higher in the high InN mixed crystal ratio regions than in the low InN mixed crystal ratio regions. However, in the case where the size of the high InN mixed crystal ratio regions is 1 nm or greater, and the density of the high InN mixed crystal ratio regions is $1.0 \times 10^{11}/cm^2$ or more, overlapping of the injected carrier density distributions occurs between the adjacent high InN mixed crystal ratio regions. As a result, the Injected carrier behaves as if it were confined in 2-dimentional quantum well rather than in a 0 dimensional quantum box, and light emitted from the side surfaces of the mesa 20 is polarized in a direction substantially parallel to the substrate surface 11a. Accordingly, the emission efficiency of the semiconductor light emitting element is significantly improved.

In the case where the size of the high InN mixed crystal ratio region is as large as 1 nm or greater, a high TE polarization ratio is obtained. However, if it is 100 nm or greater, the injected carrier density decreases. That is, in such a case, although the emission efficiency increases, the internal quantum efficiency deteriorates to a non-negligible level, and external quantum efficiency deteriorates, accordingly. Thus, the preferable size of the high InN mixed crystal ratio region is 100 nm or smaller.

Thus, in the case where the density of the high InN mixed crystal ratio regions is $1.0 \times 10^{11}/cm^2$ or more, and the size thereof is 1 nm to 100 nm, the TE polarization ratio of light emitted from the side surfaces of mesa 20 increases.

Referring again to FIGS. 1A and 1B, the active layer 14 of the semiconductor light emitting element 10 may have a single quantum well structure, which is a three layer structure consisting of a barrier layer, a well layer, and another barrier layer. Alternatively, in the case where the active layer 14 is formed as a multiple quantum well structure, as the in-plane density and the size of the high InN mixed crystal ratio regions, the averages of the in-plane density and the size of the high InN mixed crystal ratio regions in all the well layers are employed, respectively. It to confirmed that even in such a case, the TE polarization ratio depends on the in-plane density and the size of the high InN mixed crystal ratio regions with the similar tendency to that as shown in the graph of FIG. 6.

Embodiment 2

Figure 7A:
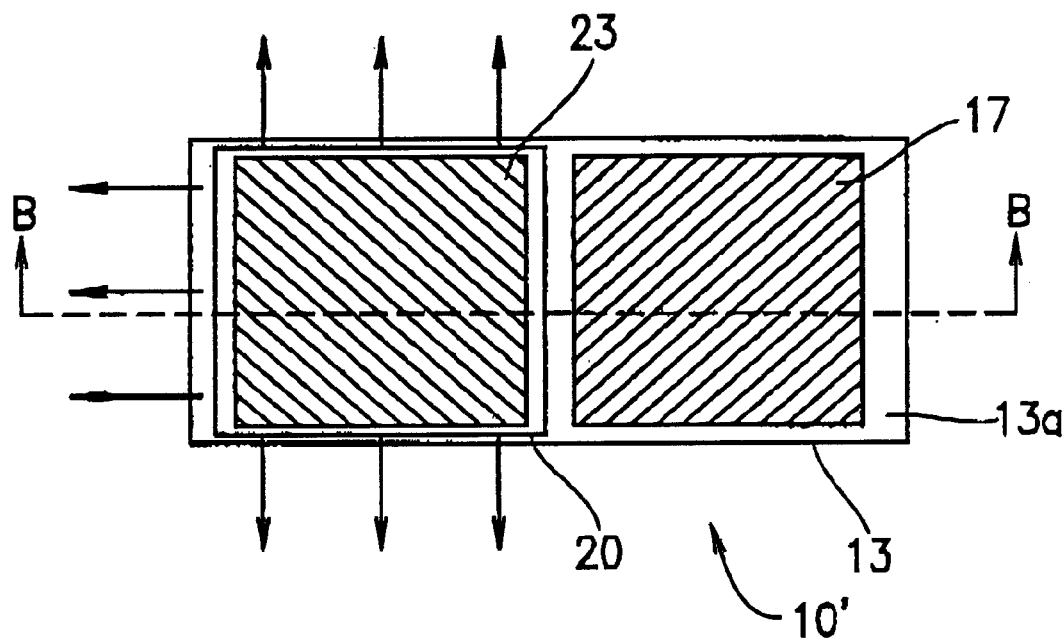
FIG. 7A is a schematic plan view showing another exemplary embodiment of a semiconductor light emitting element according to the present invention.
Figure 7B:
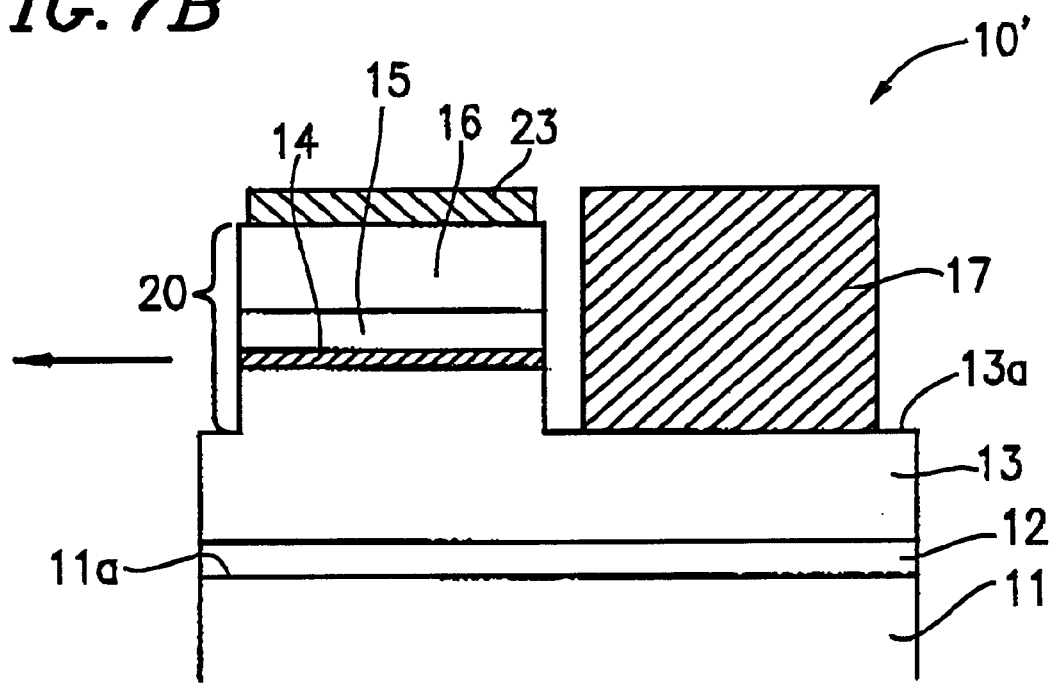
FIG. 7B is a schematic cross-sectional view taken along a line B—B of FIG. 7A.

FIG. 7A is a schematic plan view showing an exemplary embodiment of a semiconductor light emitting element according to the present invention. FIG. 7B is a schematic cross-sectional view taken along a line B—B of FIG. 7A. In a semiconductor light emitting element 10', as in the semiconduator light emitting element 10 shown in FIGS. 1A and 1B, a GaN buffer layer 12 (thickness: about 20 nm) and an n-type GaN contact layer 13 (thickness: about 4 μm) are provided over a substrate surface 11a ((0001) face) of a sapphire substrate 11 (about 100 μm×200 μm). The periphery and about a half of the upper portion of the n-type GaN contact layer 13 are removed so as to form a rectangular electrode face 13a as shown in FIGS. 7A and 7B. Provided over the unremoved portion of the n-type GaN contact layer 13 is an n-type InGaN quantum well active layer 14 in which an $In_{0.05}Ga_{0.95}N$ barrier layer (thickness: about 5 nm), an $In_{0.2}Ga_{0.8}N$ well layer (thickness: about 3 nm), and an $In_{0.05}Ga_{0.95}N$ barrier layer (thickness: 5 nm) are sequentially provided. On the quantum well active layer 14, a p-type AlGaN sublimation preventing layer 15 (thickness: about 30 nm) and a p-type GaN contact layer 16 (thickness: about 0.5 μm) are sequentially provided.

On substantially all of the rectangular electrode face 13a of the n-type GaN contact layer 13, a negative electrode 17 is formed of Al/Ti, Au/W, or the like so as to have almost the same height as that of the mesa 20. On the other hand, provide on the p-type GaN contact layer 16 is a positive electrode 23 which also serves as a positive electrode pad. For the positive electrode 23, Au/Ni, Au/Pd, etc., may be used.

The semiconductor light emitting element 10' having such a structure to also produced by the MOCVD method by the same process as the semiconductor light emitting element 10 based on the time chart as shown in FIG. 2. Thus, also in the semiconductor light emitting element 10' shown in FIGS. 7A and 7B, the well layer of the quantum well active layer 14 includes high InN mixed crystal ratio regions and low InN mixed crystal ratio regions in a plane substantially parallel to the substrate surface 11a. The size of the high InN mixed crystal ratio regions is 1 nm to 100 nm. The density of the high InN mixed crystal ratio regions in the above plane is $1 \times 10^{11}/cm^2$ or more. As a result, light emitted from the side surfaces of the mesa 20 is polarized in a direction parallel to the substrate surface 11a. In this case, the peak wavelength of the emission spectrum is 470 nm.

Furthermore, since the positive electrode 23 provided on the upper surface of the mesa 20 also serves as a positive electrode pad, no light is emitted from the upper surface of the mesa 20. Therefore, almost all components of light generated in the active layer 14 are emitted from the side surfaces of the mesa 20, and thus, the emission efficiency improves. Furthermore, since no light is emitted from the upper surface of the mesa 20, the entire upper surface of the positive electrode 23 can be used as a wire-bonding area. Thus, in the semiconductor light emitting element 10', the size of a chip can be reduced, as compared to the semiconductor light emitting element 10 shown in FIGS. 1A and 1B. Furthermore, since the positive electrode 23 also serves as an electrode pad, no fabrication step is required to form any electrode pad, and the production cost thus can be reduced.

Now, consider the characteristics of light emitted from the side surfaces of the mesa 20 of the semiconductor light emitting element 10'. In the graph of FIG. 3, a broken line 302 represents the relationship between the TE polarization ratio and the external quantum efficiency (emission efficiency). In the case where the TE polarization ratio is low, the external quantum efficiency of the semiconductor light emitting element 10' is inferior to that of the semiconductor light emitting element 10 (solid line 301). However, in the case where the TE polarization ratio is high, the external quantum efficiencies are substantially at the same level. In the case where the TE polarization ratio is greater than 10, especially in the case where it is greater than 15, the external quantum efficiency of the semiconductor light emitting element 10' to substantially the same as that of the semiconductor light emitting element 10. This is thought to be because the increase of the TE polarization ratio causes the decrease of the transmissivity in the upper surface of the mesa 20 and therefore the increase of the reflectance so that almost all the components of light generated in the active layer 14 are thus emitted from the aide surfaces of the mesa 20.

Furthermore, the result of emission pattern measurement by the optical microscope, and the results of the TEM analysis and the EPMA analysis for the semiconductor light emitting element 10' are the same as those for the semiconductor light emitting element 10.

In both the semiconductor light emitting element 10 and 10', the substrate surface of the sapphire substrate (i.e., (0001) face) may be a mirror-abraded (0001) face is which is tilted by 0.1° from the <0001> direction to the <11–20> direction. In the semiconductor light emitting element 10, with such a substrate surface, the peak wavelength of the emission spectrum is 470 nm, and the polarization ratio of light emitted from the side surfaces of the mesa is 10 or larger. Thus, a semiconductor light emitting element with the high emission efficiency and high brightness can be obtained.

Embodiment 3

Figure 8:
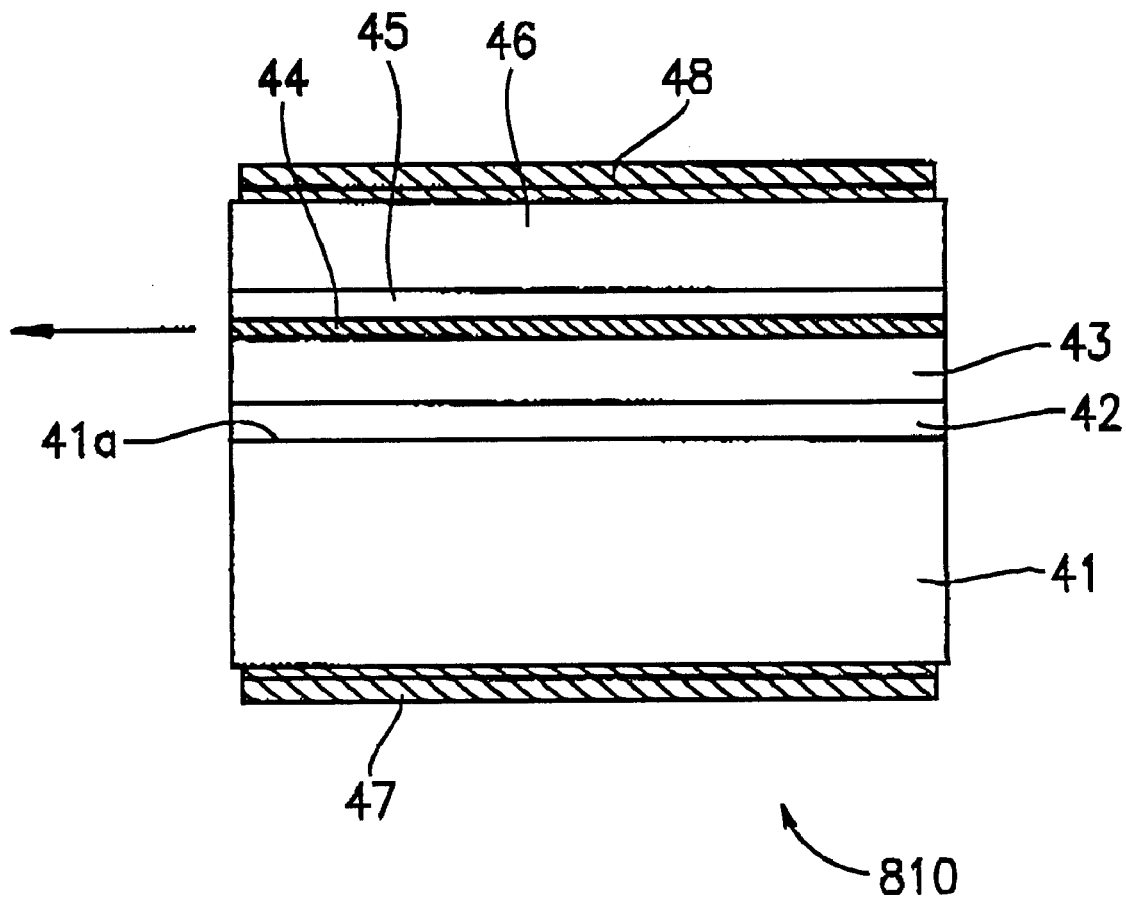
FIG. 8 is a cross-sectional view showing still another exemplary embodiment of the semiconductor light emitting element according to the present invention.

FIG. 8 is a cross-sectional view of still another example of the semiconductor light emitting element fabricated according to the present invention. A semiconductor light emitting element 810 includes, for example, a GaN substrate 41 shaped into a square of about 400 $\mu$m×400 $\mu$m. On the substrate surface 41a, (0001) face, of the GaN substrate 41, a GaN buffer layer 42 (thickness: about 20 nm) and an n-type GaN contact layer 43 (thickness: about 4 $\mu$m) are provided. Moreover, provided on the n-type GaN contact layer 43 is an n-type InGaN quantum well active layer 44 in which an $In_{0.05}Ga_{0.95}N$ barrier layer (thickness: about 5 nm), an $In_{0.2}Ga_{0.8}N$ well layer (thickness: about 3 nm on average), and an $In_{0.05}Ga_{0.95}N$ barrier layer (thickness: 5 nm) are sequentially provided. On the quantum well active layer 44, a p-type AlGaN sublimation preventing layer 45 (thickness: about 30 nm) and a p-type GaN contact layer 46 (thickness: about 0.5 $\mu$m) are sequentially provided. Furthermore, a positive electrode 48 is provided over the entire upper surface of the p-type GaN contact layer 46, and a negative electrode 47 is provided over the entire lower surface of the GaN substrate 41 on which no semiconductor layer is provided.

The well layer of the quantum well active layer 44 includes high InN mixed crystal ratio regions and low InN mixed crystal ratio regions in a plane substantially parallel to the GaN substrate 41. The size of the high InN mixed crystal ratio regions is 1 nm to 100 nm. The density of the high InN mixed crystal ratio regions in the above plane is $1\times10^{11}/cm^2$ or more.

The semiconductor light emitting element 810 is also fabricated in the same process as the crystal growth for forming the semiconductor layers of the semiconductor light emitting element 10 shown in FIGS. 1A and 1B. That is, in the crystal growth process for the quantum well active layer 44, suspension periods are provided before and after the crystal growth for forming the well layer. Moreover, after the crystal growth of the semiconductor layer has been completed, the positive electrode 48 is formed on the upper surface of the p-type GaN contact layer 46, and the negative electrode 47 is formed on the lower surface of the GaN substrate 41, obtaining the semiconductor light emitting element 810.

In the semiconductor light emitting element 810, since the GaN substrate 41 is used, the negative electrode 47 can be formed on the back face opposite to the substrate surface of the GaN substrate 41. Therefore, it is not required to form on the semiconductor layer a special area for mounting the negative electrode 47. Thus, the size of the entire semiconductor light emitting element can be reduced. In this embodiment, the size of the element is 100 $\mu$m×100 $\mu$m.

Furthermore, since the GaN substrate 41 is used in this structure, the lattice distortion which occurs between the GaN substrate 41 and semiconductor growth layers can be reduced. Therefore, the unevenness of characteristics, such as the wavelength of emitted light, among the semiconductor light emitting elements can be reduced. As a result, the production yield of the semiconductor light emitting element is significantly improved.

Figure 9:
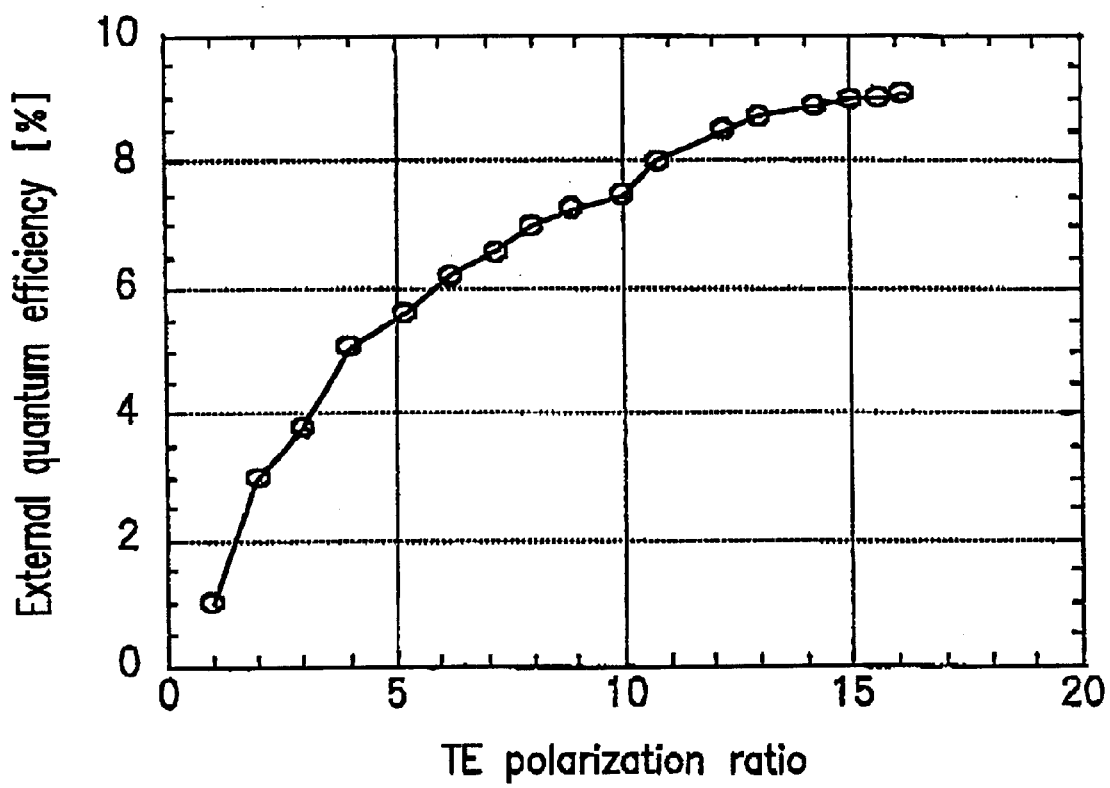
FIG. 9 shows the external quantum efficiency (%) of the light emitting element for the light emitted from side surfaces of the mesa in the semiconductor light emitting element against the ratio between the intensity of light polarized in a direction substantially perpendicular to the substrate surface and the intensity of light polarized in a direction substantially parallel to the substrate surface (TE polarization ratio).

The graph of FIG. 9 shows the relationship between the TE polarization ratio of light emitted from the side surfaces of the quantum well active layer 44 and the external quantum efficiency (emission efficiency) in the semiconductor light emitting element 810. The external quantum efficiency of the semiconductor light emitting element 810 in overall higher as compared to the semiconductor light emitting element 10'. This is because the GaN substrate 41 is transparent to light generated in the quantum well active layer 44 and is a conductive substrate, and the positive electrode 48 thus can be formed in substantially the same size as the upper surface of the semiconductor light emitting element, whereby light can be efficiently emitted from the side surfaces of the semiconductor light emitting element 810.

Furthermore, the result of emission pattern measurement by the optical microscope, and the results of the TEM analysis and the EPMA analysis for the semiconductor light emitting element 810 are the same as those for the semiconductor light emitting element 10 shown in FIGS. 1A and 1B.

Also in the semiconductor light emitting element 810, the substrate surface of the GaN substrate 41 (i.e., (0001) face) may be a mirror-abraded (0001) face which is tilted by a tilt angle of 0.05° or greater and smaller than 0.2° from the <0001> direction to the <11–20> direction.

Embodiment 4

Figure 10:
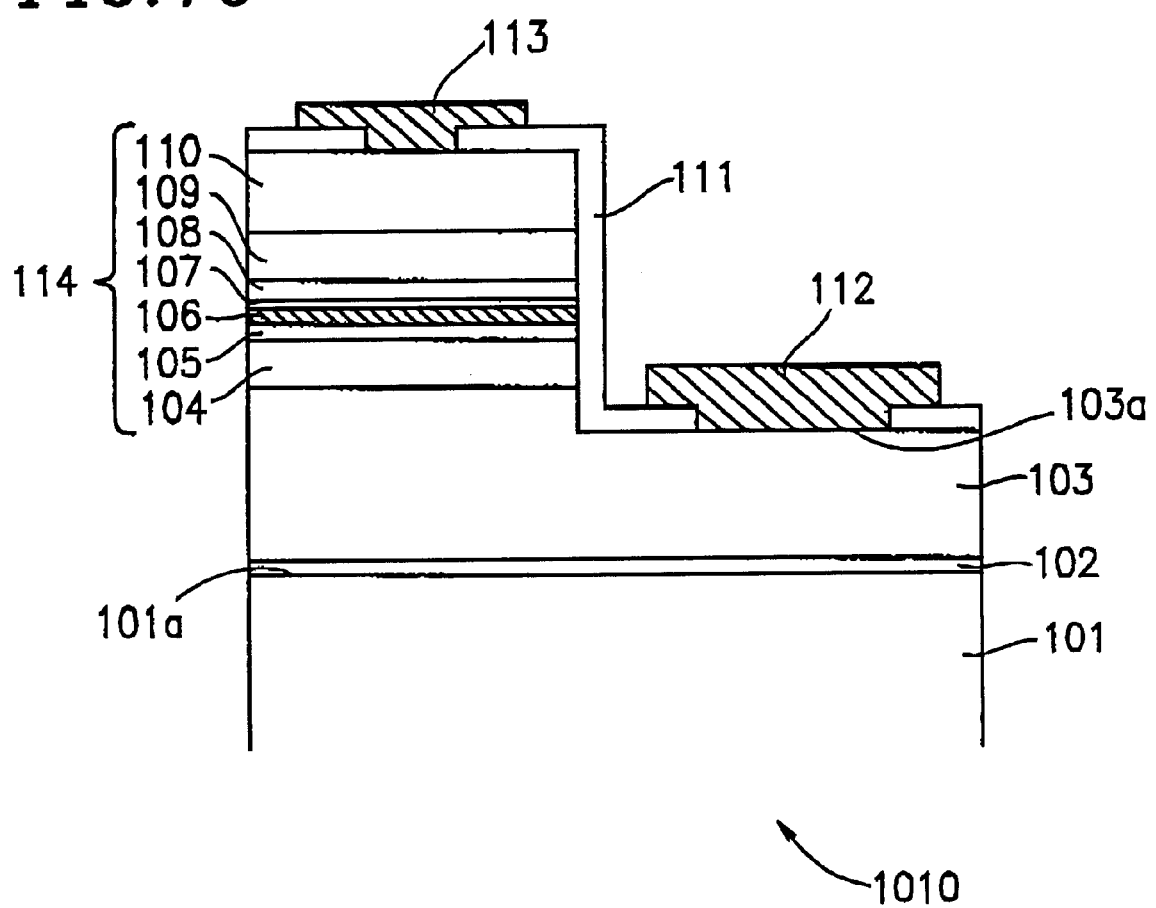
FIG. 10 is a cross-sectional view showing an exemplary embodiment of the laser element according to the present invention.

FIG. 10 is a cross-sectional view showing the structure of a nitride-gallium semiconductor laser element 1010, which is still another example of the semiconductor light emitting element fabricated according to the present invention. In the semiconductor light emitting element 1010, a GaN buffer layer 102 (thickness: about 20 nm) is provided on a substrate surface 101a ((0001) face) of a sapphire substrate 101, and an n-type GaN contact layer 103 (thickness: about 4 $\mu$m) is provided on the GaN buffer layer 102. The contact layer 103 has an electrode face 103a. Moreover, on the n-type GaN contact layer 103, an $Al_{0.15}Ga_{0.83}N$ cladding layer 104 (thickness: about 0.5 $\mu$m) and a GaN light guiding layer 105 (thickness: about 0.1 $\mu$m) are sequentially provided.

Provided on the GaN light guiding layer 105 is an n-type InGaN quantum well active layer 106 in which an n-type $In_{0.05}Ga_{0.95}N$ barrier layer (thickness: about 5 nm), an n-type $In_{0.2}Ga_{0.8}N$ well layer (thickness: about 3 nm on average), and an n-type $In_{0.05}Ga_{0.95}N$ barrier layer (thickness about 5 nm) are sequentially provided. On the quantum well active layer 106, a p-type AlGaN sublimation preventing layer 107 (thickness: about 30 nm), a p-type GaN light guiding layer 108 (thickness: about 0.1 $\mu$m), a p-type $Al_{0.15}Ga_{0.85}N$ cladding layer 109 (thickness: about 0.5 $\mu$m), and a p-type GaN contact layer 110 (thickness: about 0.5 $\mu$m) are sequentially provided.

The well layer of the quantum well active layer 106 includes high InN mixed crystal ratio regions and low InN mixed crystal ratio regions in a plane substantially parallel to a substrate surface 101a of the sapphire substrate 101. The size of the high InN mixed crystal ratio regions is 1 nm to 100 nm. The density thereof in the above plane is $1\times10^{11}/$ cm$^2$ or more.

On the p-type GaN contact layer 110, an insulating film 111 is provided so that a portion of the upper surface of the p-type GaN contact layer 110 is exposed. The insulating film 111 also covers a side(s) of the layered structure except a side(s) from which light is to be emitted, and covers the electrode face 103a of the n-type GaN contact layer 103 so as to expose a portion of the electrode face 103a. On the exposed portion of the p-type GaN contact layer 110, a positive electrode 113 is provided. Furthermore, on the exposed portion of the n-type GaN contact layer 103, a negative electrode 112 is provided.

The semiconductor light emitting element 1010 having such a structure is also fabricated by the MOCVD method by the same process as the method for fabricating the semiconductor light emitting element 10. In this embodiment, firstly, the substrate 101 is washed and installed in a crystal growing apparatus. The substrate 101 is thermally treated for about 10 minutes in an H$_2$O gas atmosphere of about 1100° C. Then, the temperature of the atmosphere is decreased to about 500° C. to 600° C. After the decreased temperature has become stable, carrier gas is switched to nitrogen gas, and the total flow rate of nitrogen gas is set to 10 /min whereby ammonia gas is supplied at a flow rate of about 3 /min. Then, after a few seconds, TMG is supplied for about one minute at a flow rate of about 20 μmol/min, so as to grow a GaN buffer layer 102 under the decreased temperature condition. The thickness of the grown GaN buffer layer 102 is about 20 nm. Thereafter, the provision of the TMG is stopped, and the temperature is increased to 1050° C. Then, TMG is supplied again at a flow rate of about 50 μmol/min, and SiH$_4$ gas to supplied at a flow rate of about 10 nmol/min, so that an n-type GaN contact layer 103 is grown to a thickness of about 4 μm. Next, TMA is supplied at a flow rate of 10 μmol/min so as to grow an n-type Al$_{0.15}$Ga$_{0.85}$N cladding layer 104 to a thickness of 0.5 μm. Then, the provision of TMA is stopped so as to grow an n-type GaN light guiding layer 105 to a thickness of about 0.1 μm.

Thereafter, similarly to the case of fabricating the semiconductor light emitting element 10, material gases are respectively supplied based on the time chart of FIG. 2. That is, after the n-type GaN light guiding layer 105 has been grown (see period T$_1$), the provision of the SiH$_4$ gas and TMG in stopped while the provision of the NH$_3$ gas continues, and the temperature of the substrate 11 is decreased to, for example, about 650–850° C., whereby the quantum well active layer 106 starts to grow (period T$_2$).

The growth temperature of the quantum well active layer 106 is one of the parameters that determine the emission wavelength of a laser beam emitted by a semiconductor light emitting element to be produced. As the growth temperature becomes lower, the emission wavelength becomes longer. In the case where the temperature of the substrate 101 is in the range from 650° C. to 860° C., the produced semiconductor light emitting element emits light in the wavelength range from purple to green. Thus, the temperature of the substrate 101 may be changed in order to produce a semiconductor light emitting element that emits light in the wavelength range of other colors.

Then, after the temperature of the substrate 101 has become stable, the supply quantity of the NH$_3$ gas is increased, and both TMG and TMI are supplied at a flow rate of 10 μmol/min, whereby an n-type In$_{0.05}$Ga$_{0.95}$N barrier layer is grown so as to have a thickness of about 5 nm on average (period T$_2$).

After the barrier layer has been grown, the provision of TMG and TMI is once stopped while the provision of the carrier gas and the NH$_3$ gas continues. Under such a condition, the provision of III-group material gasses is substantially stopped for 1 to 300 seconds, thereby suspending the growth of crystal grains (period T$_4$).

After the suspension period, TMG is supplied at a flow rate of 10 μmol/min and TMI is supplied at a flow rate of 50 μmol/min, whereby an In$_{0.2}$Ga$_{0.8}$N well layer is grown so as to have a thickness of about 3 nm on average (period T$_5$). After the well layer has been grown, the provision of TMG and TMI is stopped again while the provision of the carrier gas and the NH, gas continues, and the provision of III-group material gasses is substantially stopped for 1 to 300 seconds, thereby suspending the growth of crystal grains (period T$_6$). Thereafter, the provision of TMG and TMI is resumed at a flow rate of 10 μmol/min for each of these materials, whereby an n-type In$_{0.05}$Ga$_{0.95}$N barrier layer is formed so as to have a thickness of about 5 nm.

As described above, the quantum well active layer 106 in which a well layer is sandwiched by a pair of barrier layers has been formed. As occasion demands, the growth of a barrier layer and a well layer may be repeated several times so as to form a plurality of well layers. In the case where the growth of crystal grains is suspended before and after the formation of the plurality of well layers, the quantum well active layer 106 having two to ten well layers emits light most efficiently. Furthermore, in the growth of the quantum well active layer 14, SiH$_4$ gas may be supplied at a flow rate of about 10 nmol/min so as to add Si to the well layer and/or the barrier layers.

After one or a plurality of well layers have been formed. TMG is supplied at a flow rate of 10 μmol/min and TMA is supplied at a flow rate of 5 mol/min, along with the provision of Cp$_2$Mg gas (period T$_8$). As a result, a p-type AlGaN sublimation preventing layer 107 is formed so as to have a thickness of about 30 nm.

Then, the provision of TMG, TMI, and Cp$_2$Mg gases is stopped, while the provision of the NH$_3$ gas continues, and the temperature of the substrate 101 is again increased to 1050° C. (period T$_9$). After the temperature of the substrate 101 has been increased to the predetermined temperature, TMG is supplied at a flow rate of 50 μmol/min along with the provision of the CP$_2$Mg gas, so that a p-type GaN light guiding layer 108 is grown to a thickness of about 0.1 μm (period T$_{10}$). Then, TMA to supplied at a flow rate of 10 μmol/min so as to grow an Al$_{0.15}$Ga$_{0.85}$N cladding layer 109 to a thickness of about 0.5 μm. Thereafter, the provision of TMA is stopped so as to grow a p-type GaN contact layer 110 to a thickness of about 0.5 μm. After the semiconductor layer has been deposited in such a manner, the provision of TMG and the Cp$_2$Mg gas is stopped, and the heating of the substrate 101 is terminated.

After the semiconductor layers have been deposited by the MOCVD method, substantially a half of the resultant semiconductor layered structure is removed, by the photolithography technique and the reactive ion etching technique, from the upper surface of the resultant semiconductor layered structure to an intermediate position of the n-type GaN contact layer 103, thereby forming an electrode section 103a.

Thereafter, by the photolithography technique, an insulating film 111 to formed over the resultant structure except for a portion in which a positive electrode 113 is to be formed in contact with the upper surface of the p-type G&N contact layer 110 and a portion in which the negative electrode 112 is to be formed in contact with the electrode section 103a.

Then, the positive electrode 113 is formed on the exposed portion of the upper surface of the p-type GaN contact layer 110, and the negative electrode 112 is formed on the electrode section 103a of the n-type GaN contact layer 103.

The sapphire substrate 101 is typically prepared in the form of a wafer. After the semiconductor layers have been formed on the wafer by the MOCVD method and the etching process has performed thereto, the wafer is divided into square chips (400 μm×400 μm), thereby obtaining a semiconductor light emitting element 1010 as shown in FIG. 10.

Furthermore, in the semiconductor laser element 1010 shown in FIG. 10, tilting the orientation of the substrate by 0.1° can increase the polarization ratio of spontaneous emission light from the active layer of the semiconductor laser element. Even in the case where the injected current to ½of the threshold value, the polarization ratio of spontaneous emission light is 10 or larger. As a result, more components of spontaneous emission light are coupled to the laser oscillation mode, and the noise of the feedback induced noise thus can be reduced. The tilt angle of the orientation of the substrate is not limited to 0.1°, but may be 0.05° or more and smaller than 0.2°.

Embodiment 5

Figure 11:
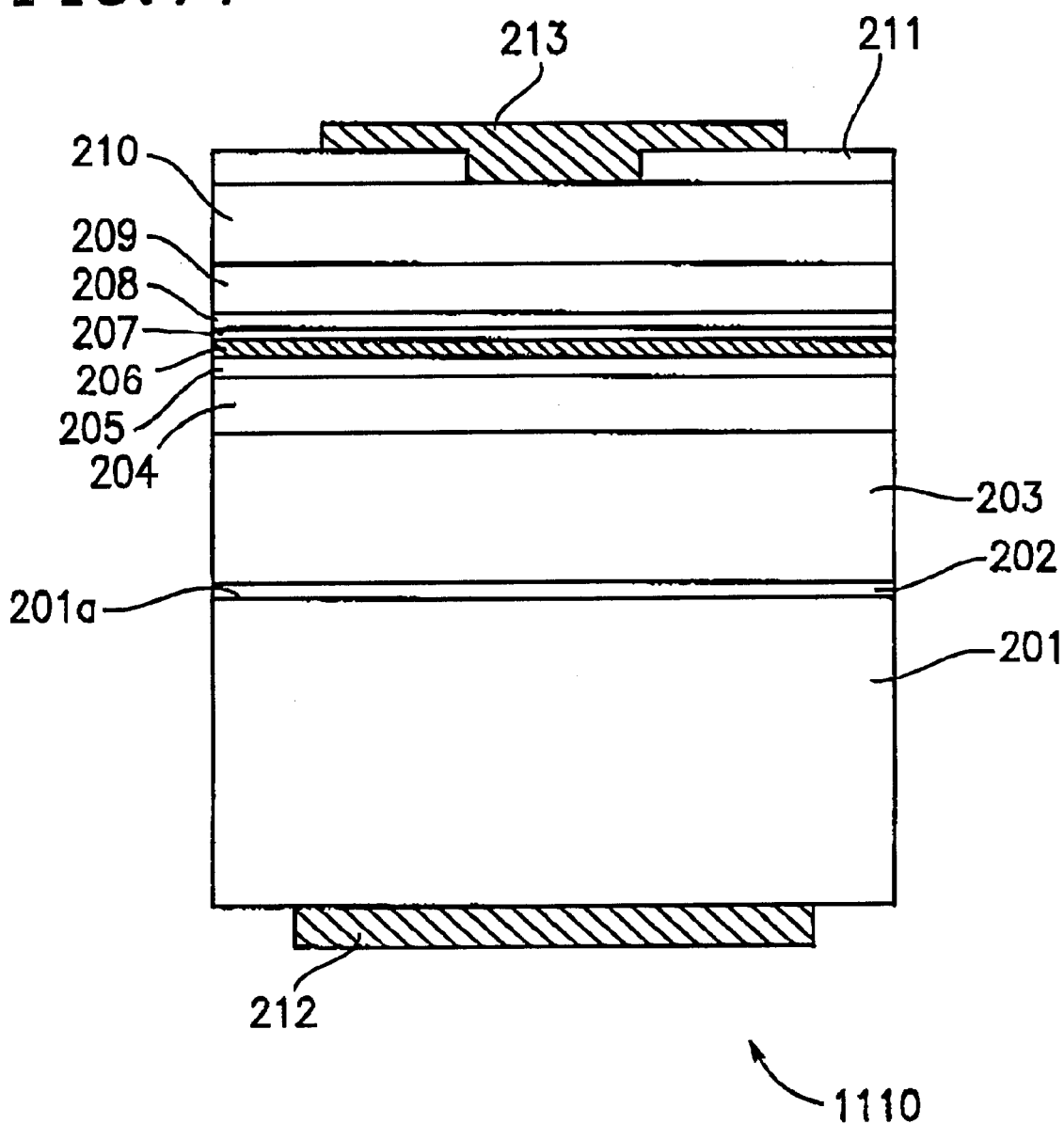
FIG. 11 is a cross-sectional view showing another exemplary embodiment of the laser element according to the present invention.

FIG. 11 is a cross-sectional view showing the structure of a nitride-gallium semiconductor laser element 1110, which is still another example of the semiconductor light emitting element fabricated according to the present invention. In the semiconductor light emitting element 1110, a GaN buffer layer 202 (thickness: about 20 nm) is provided on a substrate surface 201a ((0001) face) of a GaN substrate 201, and an n-type GaN contact layer 203 (thickness: about 4 μm) is provided on the GaN buffer layer 202. Moreover, on the n-type GaN contact layer 203, an $Al_{0.15}Ga_{0.85}N$ cladding layer 204 (thickness: about 0.5 μm) and a GaN light guiding layer 205 (thickness: about 0.1 μm) are sequentially provided.

Provided on the GaN light guiding layer 205 is an n-type InGaN quantum well active layer 206, in which an n-type $In_{0.05}Ga_{0.95}N$ barrier layer (thickness: about 5 nm), an n-type $In_{0.2}Ga_{0.8}N$ well layer (thickness: about 3 nm on average), and an n-type $In_{0.05}Ga_{0.95}N$ barrier layer (thickness: about 5 nm) are sequentially provided. On the quantum well active layer 206, a p-type AlGaN sublimation preventing layer 207 (thickness: about 30 nm), a p-type GaN light guiding layer 208 (thickness about 0.1 μm), an $Al_{0.15}Ga_{0.85}N$ cladding layer 209 (thickness: about 0.5 μm), and a p-type GaN contact layer 210 (thickness: about 0.5 μm) are sequentially provided.

The well layer of the quantum well active layer 206 includes high InN mixed crystal ratio regions and low InN mixed crystal ratio regions in a plane substantially parallel to a substrate surface 201a of the GaN substrate 201. The size of the high InN mixed crystal ratio regions is 1 nm to 100 nm. The density thereof in the above plane is $1\times10^{11}/cm^2$ or more.

Over the p-type GaN contact layer 210, an insulating film 211 is provided So as to expose a portion of the upper surface of the p-type GaN contact layer 210. Furthermore, a positive electrode 213 is provided on the exposed portion of the p-type GaN contact layer 210 through the insulating film 211. On the other side, a negative electrode 212 is provided on the lower surface of the GaN substrate 201.

In the semiconductor light emitting element 1110 also, the semiconductor layers are grown in the same manner as the crystal growth for forming the semiconductor layers of the semiconductor light emitting element 1010 shown in FIG. 10. That is, in the crystal growth for forming the quantum well active layer 206, the suspension periods of the crystal growth are provided before and after the crystal growth of the well layer. Then, after the crystal growth of the semiconductor layer has been completed, an insulating film 211 is formed by the photolithography technique on the upper surface of the p-type GaN contact layer 210 except for a portion in which the positive electrode 213 is to be formed. Thereafter, a positive electrode 213 is formed on a portion of the upper surface of the p-type GaN contact layer 210 which is not covered by the insulating film 211, and a negative electrode 212 is formed on the lower surface of the GaN substrate 201, thereby obtaining the semiconductor laser element 1110.

The quantum well active layer 206 of the semiconductor laser element having such a structure is completely the same as the quantum well active layer 106 of the semiconductor laser element 1010 shown in FIG. 10. When the semiconductor laser element was driven by injecting a current equal to a ½of the oscillation threshold, and the spontaneous emission light from an end face of the quantum well active layer 206 was observed, it was found that the TE polarization ratio of the light spontaneously emitted from the end face is dependent on the suspension period of the crystal growth in the midst of growing semiconductor crystal. This dependency is similar to the graph of FIG. 4. Furthermore, the relationships of the TE polarization ratio of the spontaneous emission light with respect to the in-plane density and to the size of the high InN mixed crystal ratio regions in the well layer of the quantum well active layer 206 are similar to those represented by the graphs of FIG. 6.

In the production process of the semiconductor laser element 1110 also, the suspension periods of the crystal growth in the growth of the semiconductor layers are set to 1 to 300 seconds based on the graph of FIG. 4. The suspension period of the crystal growth before and after the crystal growth of each well layer is preferably set to 5 to 200 seconds, and more preferably, 10 to 80 seconds. In the thus-produced semiconductor laser element, when the infected current is a ½of the threshold value, light spontaneously emitted from the end face to polarized in a direction substantially parallel to the substrate surface. The oscillation peak wavelength is 410 nm.

Furthermore, the result of emission pattern measurement by the optical microscope, and the results of the TEM analysis and the EPMA analysis for the is semiconductor laser element 1110 were the same an those for the semiconductor laser element 1010 shown in FIG. 10.

In the present embodiment, when the semiconductor laser element 1110 was driven (laser oscillation) by a current greater than threshold value, the laser element oscillated in the TE mods, and the oscillation spectrum exhibited the tendency to generate the longitudinal multimode. This is because light generated in and emitted from the quantum well active layer 206 is polarized in a direction substantially parallel to the substrate surface, the spontaneous emission light thus can be readily converted to the laser oscillation mode, and as a result, the coupling factor $\beta_{sp}$ of the spontaneous emission light is large as compared to the case where the spontaneous emission light is not polarized.

In the present embodiment, the semiconductor laser element 1110 has a short coherence length, and thus, when it is used as a light source of an optical information reproduction device for an optical disk or the like, the noise of the feedback induced molds can be reduced.

In the semiconductor laser element having such a structure, since the GaN substrate 201 is used, the negative electrode 212 can be formed on the lower surface of the GaN substrate 201. Therefore, it is not required to form on the semiconductor layer a special area for mounting the negative electrode 212. Thus, the size of the entire semiconductor laser element can be reduced. In this embodiment, the size of the element is 400 μm×200 μm.

Furthermore, since the GaN substrate 201 is used in this embodiment, the lattice distortion which occurs between the GaN substrate 201 and the semiconductor growth layers can be reduced. Therefore, the unevenness of characteristics, such as the wavelength of emitted light, among the Semiconductor light emitting elements can be reduced. As a result, the production yield of the semiconductor light emitting element significantly improves.

Furthermore, in the semiconductor laser element 1110 shown in FIG. 11, tilting the orientation of the substrate by 0.1° can increase the polarization ratio of spontaneous emission light from the active layer of the semiconductor laser element. Even in the case where the injected current is ½ of the threshold value, the polarization ratio of spontaneous emission light is 10 or larger. As a result, more components of spontaneous emission light are coupled to the laser oscillation mode, and the noise of the feedback induced noise thus can be reduced. The tilt angle of the orientation of the substrate is not limited to 0.1°, but may be 0.05° or more and smaller than 0.2°.

Embodiment 6

Figure 12:
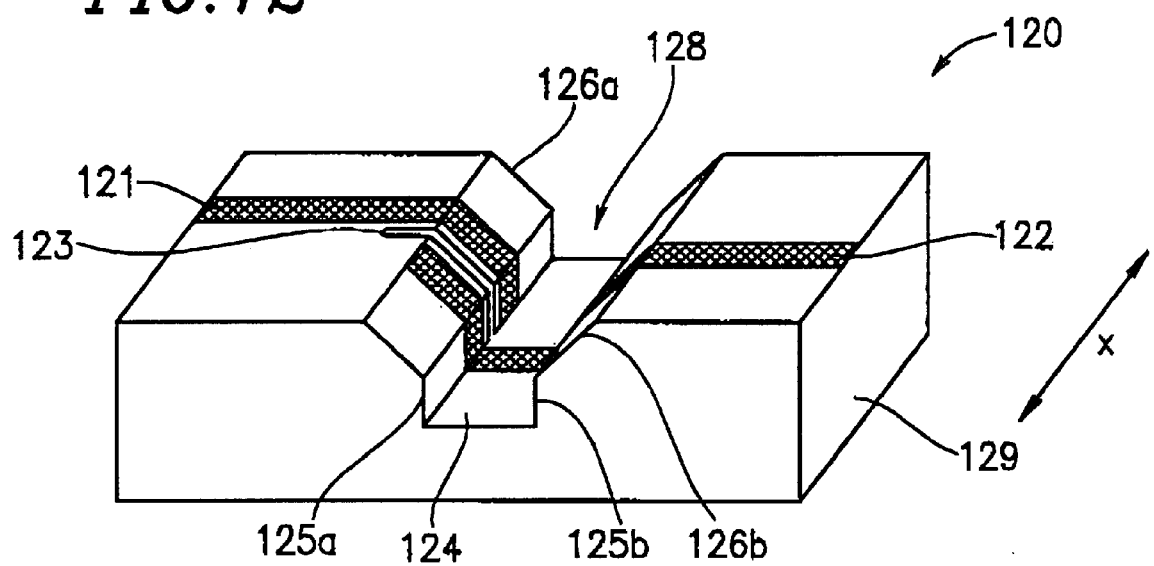
FIG. 12 shows an example of a mold case for vertically sustaining the semiconductor light emitting element shown in FIGS. 7A and 7B.

FIG. 12 shows an example of a mold case 120 for sustaining the semiconductor light emitting element 10' shown in FIGS. 7A and 7B. The mold case 120 includes a rectangular insulating base 129 having a groove section 128 in the central portion of the upper face which runs in a direction along the width of the insulating base 129 as shown by an arrow X. The groove section 128 consists of a horizontal bottom face 124, walls 125a and 125b standing vertically at the opposite sides of the bottom face 124, and slant faces 126a and 126b formed continuously from the walls 125a and 125b. Each of the slant faces 126a and 126b continues to the upper flat face of the insulating base 129.

In the central area of the upper aide of the insulating base 129 in the width direction thereof, i.e., the central area of the groove section 128 in the longitudinal direction thereof, a slit 123 is formed in the wall 125a, the slant face 126a, and the upper face of the insulating base 129 perpendicular to the width direction of the insulating base 129. The opening of the slit 123 faces the inside of the groove section 128.

On one side of the slit 123, an interconnection 121 is provided on the wall 125a, the slant face 126a, and the upper face of the insulating base 129. On the other side of the alit 123, an interconnection 122 is provided on the slant face 126a and the wall 125a. The interconnection 122 is also continuously provided on the bottom face 124, the wall 125b, the slant face 126b, and the upper face of the insulating base 129.

The height of the walls 125a and 125b is 20 μm to 500 μm, and desirably, it is slightly smaller than each side of a semiconductor light emitting element to be mounted thereon. Especially, it is desirable that the height of the walls 125a and 125b be 100 μm to 200 μm. In addition, It is preferable that the width of the slit 123 be 190 μm or smaller, and especially, be about 100 μm.

Figure 13A:
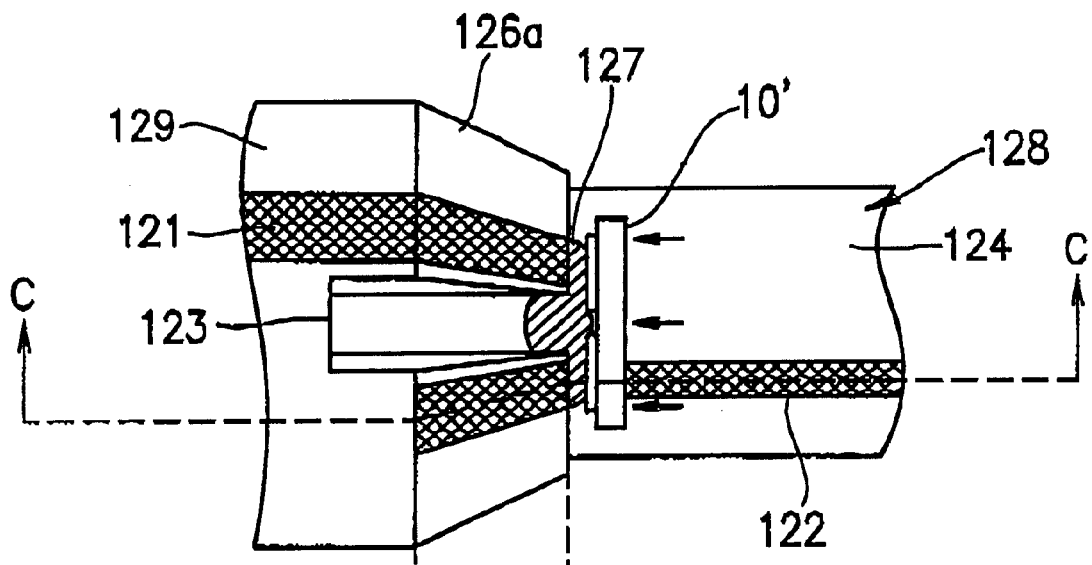
FIG. 13A is a perspective view from above showing the combination of the mold case and the semiconductor light emitting element mounted therein.
Figure 13B:
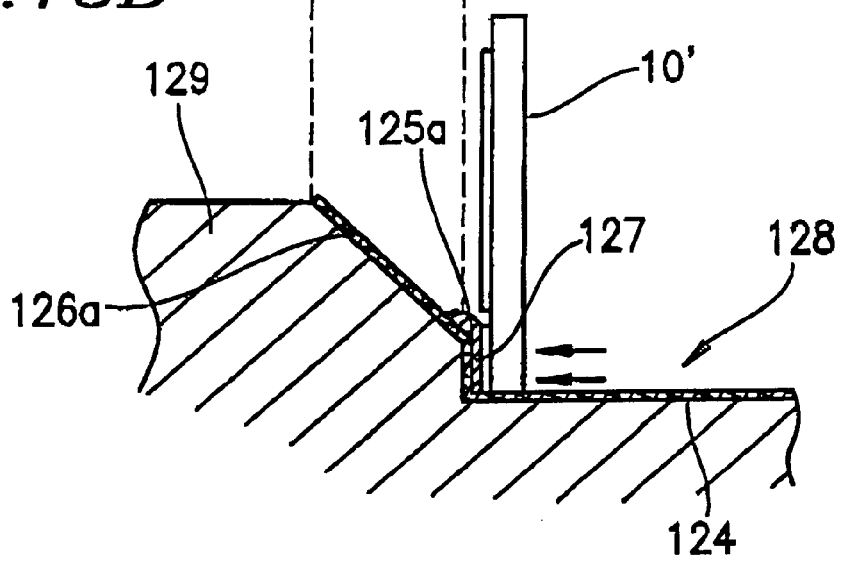
FIG. 13B is a cross-sectional view taken along a line C—C of FIG. 13A.

FIG. 13A is a perspective view from above showing the combination of the mold case 120 (FIG. 12) and the semiconductor light emitting element 10' (FIGS. 7A and 7B) mounted therein. FIG. 13B is a cross-sectional view taken along a line C—C of FIG. 13A. When the semiconductor light emitting element 10' is mounted, in the first place, an anisotropic conductive resin adhesive 127 is applied on the interconnections 121 and 122 formed on the wall 125a. One example of the anisotropic conductive resin adhesive 127 is "Hysol TG-9000R" available from Dexter Corporation, which is made by mixing several to several tens of percents by weight of conductive coarse particle (particle size: about 10 μm or smaller) in transmissive epoxy resin liquid. Next, the semiconductor light emitting element 10' is attached to the wall 125a through the anisotropic conductive resin adhesive 127 so that the sapphire substrate 11 of the semiconductor light emitting element 10' is parallel to the wall 125a, and the interconnections 121 and 122 face the positive and negative electrode pads, respectively.

In such a structure, the anisotropic conductive resin adhesive 127 is cured while a pressure of about 2–20 kgf/cm² is applied to the semiconductor light emitting element 10' toward the wall 125a (as shown by arrows). The curing conditions differ among different types of the anisotropic conductive resin adhesives 127. In the present embodiment, the resin adhesive 127 was cured for a time ranging from 2 minutes at 150° C. to 30 seconds at 200° C.

In this case, between the electrode pads and the interconnections 121 and 122, the anisotropic conductive resin adhesive 127 it cured under the above pressure. Accordingly, the conductive particles contained in the anisotropic conductive resin adhesive 127 are in contact with one another, and the anisotropic conductive resin adhesive 127 is thus conductive between the electrode pads and the interconnections 121 and 122. However, on the other hand, in the slit 123 between the interconnections 111 and 122, the anisotropic conductive resin adhesive 127 is cured in the absence of the above pressure, and the conductive particles are dispersed in the anisotropic conductive resin adhesive 127 without contact with one another. Thus, the anisotropic conductive resin adhesive 127 in the slit 123 is kept insulative between the interconnections 121 and 122. As a result, it is conductive between each of the positive and negative electrode pads and the corresponding interconnection (121 or 122), while the electrical separation is kept between the electrode pads and between the interconnections 121 or 122. The semiconductor light emitting element 10' is mounted in the mold case 120 with such a conduction arrangement.

The semiconductor light emitting element 10' mounted in the mold case 120 as described above emits light in a direction parallel to the substrate of the element 10'. Thus, light in a direction perpendicular to the bottom face 124 can be readily obtained.

Assuming that the maximum particle size of the conductive particle such as metal powder contained in the anisotropic conductive resin adhesive 127 is for example 5 μm, it is required to design the slit 123 so as to have a depth of at least 5 μm.

Note that the semiconductor light emitting element to be mounted in the mold case 120 is not limited to the semiconductor light emitting element 10'. Any type of semiconductor light emitting element may be mounted in the mold case 120.

Embodiment 7

Figure 14A:
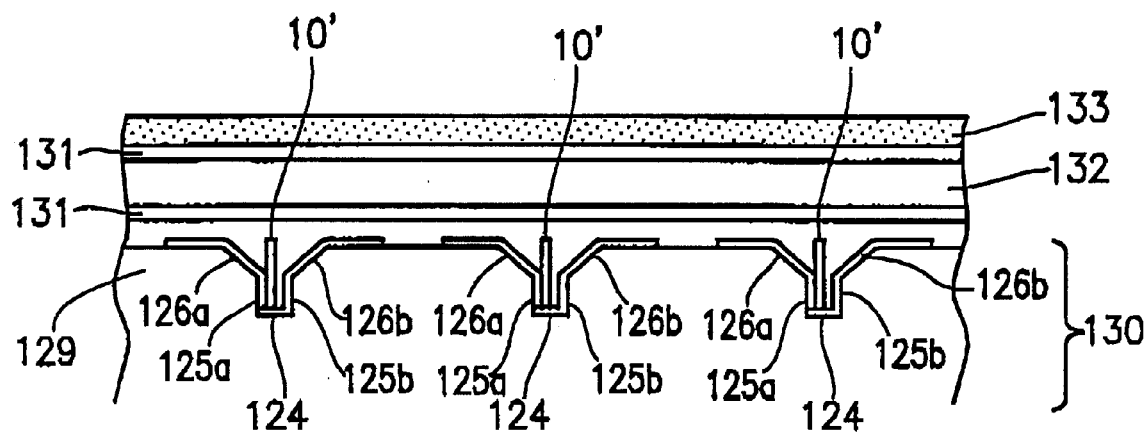
FIG. 14A is a cross-sectional view showing a principal portion of a liquid crystal display device using a plurality of semiconductor light emitting elements shown in FIGS. 7A and 7B.
Figure 14B:
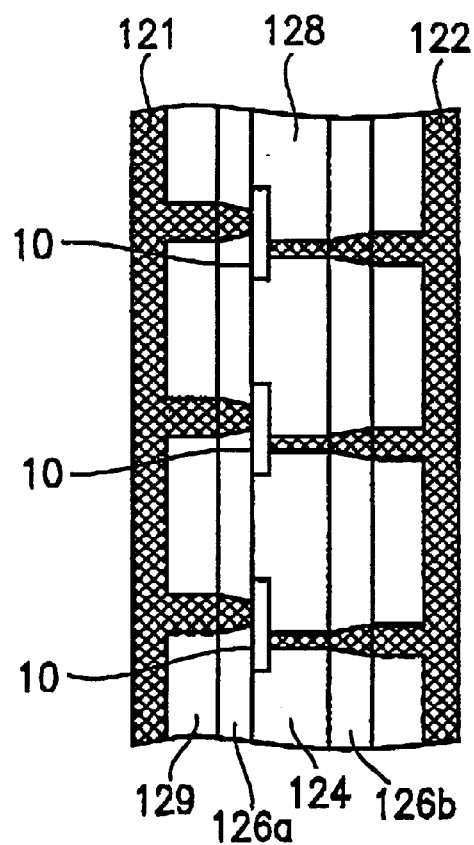

FIG. 14A is a cross-sectional view showing a principal portion of a liquid crystal display device produced according to the present invention, which uses a plurality of semiconductor light emitting elements 10' shown in FIGS. 7A and 7B. This liquid crystal display device uses a mold case 130 formed by arranging the mold cases 120 shown in FIG. 12 integrally in a matrix. In the mold case 130, the mold cases 120 are arranged in a matrix so that a plurality of groove sections 128 are oriented in the same direction. Bach groove section 128 has the structure as shown in FIG. 12. In each groove section 128, a semiconductor light emitting element 10' is attached to the wall 125a along the groove section 128 through the anisotropic conductive resin adhesive 127 as shown in FIG. 12. Moreover, the interconnections 121 and 122 are respectively connected to the neighboring interconnections 121 and 122 along the groove section 128 as shown in FIG. 14B.

Referring to FIG. 14A, over the mold case 130, a liquid crystal plate 132 is provided so as to cover the semiconductor light emitting elements 10'. The liquid crystal plate 132 has transparent electrodes 131 on both faces thereof. Furthermore, a polarizer 133 is provided on the upper side of the liquid crystal plate 132 opposite to the mold case 130.

The semiconductor light emitting element 10' is attached to the wall 125a in the groove section 128 of the mold case 130 so that the sapphire substrate 11 stands vertically on the bottom face 124. Each of the positive and negative electrodes of the semiconductor light emitting elements 10' is connected to the corresponding interconnection (121 or 122) formed on the mold case 130 through the anisotropic conductive resin adhesive 127.

Almost all the components of light emitted from the semiconductor light emitting elements 10' are output vertically in a direction parallel to the sapphire substrate 11 toward the liquid crystal plate 132. In this case, light emitted from the semiconductor light emitting elements 10' is polarized in a direction parallel to the sapphire substrate 11. Therefore, light which passes through the polarizer 133 can be on/off-controlled by turning on/off a voltage to be applied to the liquid crystal plate 132 while the quantity of a current provided to the semiconductor light emitting elements 10' and the emission power are kept stable.

When the liquid crystal plate 132 is in the off state (i.e., no voltage is applied to the liquid crystal plate 132), light is polarized by the liquid crystal plate 132 in a certain direction. In the case where the orientation of the polarizer 133 is set so that the polarizer 133 transmits the light polarized in the above direction in the maximum quantity, when the liquid crystal plate 132 is in the on state (i.e., a voltage is applied to the liquid crystal plate 132), the polarization direction of light transmitted through the liquid crystal plate 132 is changed, and the quantity of light transmitted through the polarizer 133 is reduced. According to such a principle, the light transmitted through the polarizer 133 can be on/off-controlled.

Thus, since it is not required to provide a polarizer to the surface of the liquid crystal plate 132 in the vicinity of the semiconductor light emitting element 101, a liquid crystal panel can be readily fabricated, and the fabrication cost can be reduced. Furthermore, an area covered by a single semiconductor light emitting element 10' can be reduced relatively with respect to an entire area of the liquid crystal panel because the semiconductor light emitting element 10' is mounted in the mold case 130 so that the semiconductor light emitting element 10' stands in a direction substantially perpendicular to the large face of the mold case 130. As a result, finer display resolution can be obtained in the liquid crystal display device of the present invention. Furthermore, in a nitride semiconductor light emitting element which serves as a light source of blue light, since light emitted from side surfaces can be polarized, a full-color liquid crystal display device can be realized with such a semiconductor light emitting element.

Embodiment 8

Figure 16:
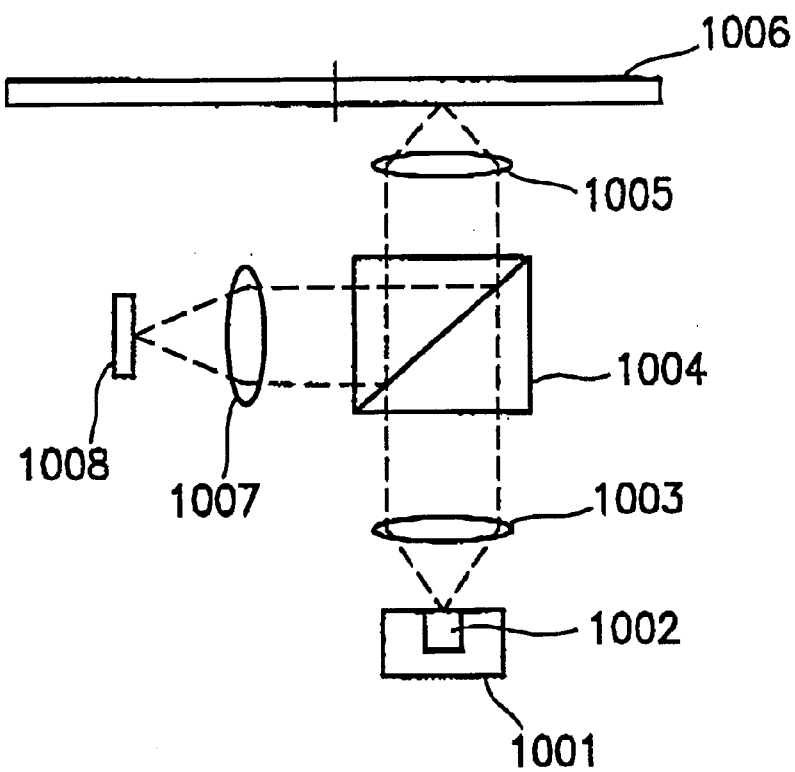
FIG. 16 shows a structure of an optical information reproduction device using the semiconductor light emitting element of the present invention.

FIG. 16 shows a structure of an optical information reproduction apparatus using a semiconductor laser element according to the present invention. This optical information reproduction apparatus includes a base 1001, a semiconductor laser element 1002 mounted on the base 1001, a collimator lens 1003 for converting light emitted from the semiconductor laser element 1002 into parallel light, a beam splitter 1004 which is irradiated with the parallel light from the collimator lens 1003, an objective lens 1005 for converging light output from the beam splitter 1004 on an optical disk 1006. Furthermore, at a side of the beam splitter 1004, a lens 1007 for converging light reflected by the optical disk 1006 and a photodetector 1008 for detecting the converged light are provided. As the semiconductor laser element 1002, for example, the semiconductor laser element 1010 shown in FIG. 10 or the semiconductor laser element 1110 shown in FIG. 11 can be used.

In this optical information reproduction apparatus, a laser beam emitted from the semiconductor laser element 1002 1a converted by the collimator lens 1003 to parallel light or generally parallel light. Then, this converted light is transmitted through the beam splitter 1004 and converged on an information recording surface of the optical disk 1006 by the objective lens 1005. On the information recording surface of the optical disk 1006, there is bit information written by concavities/convexities, magnetic modulation, or refractive index modulation. The laser beam converged on the optical disk 1006 is reflected by the information recording surface, transmitted through the objective lens 1005, branched by the beam splitter 1004, and converged by the lens 1007 on the photodetector 1008. Then, a signal optically detected by the photodetector 1008 is converted to an electric signal. In such a manner, the recorded information is read out.

An optical information reproduction apparatus having such a structure uses the semiconductor laser element 1002 in which the spontaneous emission light is polarized in a direction substantially parallel to the substrate surface, and thus, a superior noise characteristic can be obtained. Therefore, in such an optical information reproduction apparatus, a significantly low bit error rate is achieved.

In the optical information reproduction apparatus shown in FIG. 16, when the semiconductor laser element shown in FIGS. 10 or 11 was used as the semiconductor laser element 1002, from an optical disk on which information is recorded at a high density of 5 Mbit/mm$^2$, the recorded information was read out with a bit error rate of $10^{-6}$. On the other hand, when the conventional semiconductor laser element was used instead of the semiconductor laser element 1002, the bit error rate was about $10^{-3}$ under the same conditions as the above case. That is, the optical information reproduction apparatus using the conventional semiconductor laser element is not suitable for practical use.

Thus, in the optical information reproduction apparatus of the present invention, since information can be read out from a high-density optical disk at a low error rate, the noise characteristic significantly improves.

In the above embodiments, InGaN is employed as a semiconductor material for the barrier layer and the well layer in the quantum well active layer. However, the present invention is not limited to this material, and other semiconductor material may be used. For example, GaNAs to employed in order to obtain light at a wavelength of 450 to 600 nm, and GaNP is employed in order to obtain light at a wavelength of 450 to 650 nm. Furthermore, in each of the above embodiments, the GaN buffer layer may be omitted.

As described hereinabove, in a semiconductor light emitting element of the present invention, since light spontaneously emitted from end faces of a quantum well active layer is polarized in a direction substantially parallel to a substrate surface, the emission efficiency significantly improves. Furthermore, in a semiconductor laser element of the present invention, the noise characteristic significantly improves.

Various other modifications will be apparent to and can be readily made by those skilled in the art without departing from the scope and spirit of this invention. Accordingly, it to not intended that the scope of the claims appended hereto be limited to the description as set forth herein, but rather that the claims be broadly construed.

What is claimed is:

1. A semiconductor light emitting element, comprising:
   a first conductive type layer made of a nitride semiconductor which is deposited on a substrate;
   a quantum well active layer made of $Al_P Ga_Q In_{1-P-Q} N$ ($0 \leq P$, $0 \leq Q$, $P+Q<1$) which is deposited on the first conductive type layer, the quantum well active layer including a pair of barrier layers and a well layer interposed therebetween; and
   a second conductive type layer made of a nitride semiconductor which is deposited on quantum well active layer,
   wherein spontaneous emission light emitted from end faces of the quantum well active layer is polarized in a direction parallel to the substrate;
   the well layer includes, in a mixed state, regions in which an in content is high and regions in which an in content is low; and
   an average size of the regions in which an in content is high is 5 nm to 100 nm from larger than 5 nm up to and including 100 nm.

2. A semiconductor light emitting element according to claim 1, wherein:
   the substrate is a sapphire substrate or a GaN substrate; and
   the first conductive type layer is deposited on a (0001) face of the sapphire substrate or the GaN substrate.

3. A semiconductor light emitting element, comprising:
   a first conductive type layer made of a nitride semiconductor which is deposited on a substrate;
   a quantum well active layer made of $Al_P Ga_Q In_{1-P-Q} N$ ($0 \leq P$, $0 \leq Q$, $P+Q<1$) which is deposited on the first conductive type layer, the quantum well active layer including a pair of barrier layers and a well layer interposed therebetween; and
   a second conductive type layer made of a nitride semiconductor which is deposited on the quantum well active layer,
   wherein spontaneous emission light emitted from end faces of the quantum well active layer is polarized in a direction parallel to the substrate, and
   wherein:
      the substrate is a sapphire substrate;
      the first conductive type layer is deposited on a face tilted from a (0001) face of the sapphire substrate by an angle equal to or greater than 0.05° and smaller than 0.20°; and
      regions of high in content and regions of low in content are provided within the active layer.

4. A semiconductor light emitting element, comprising:
   a first conductive type layer made of a nitride semiconductor which is deposited on a substrate;
   a quantum well active layer made of $Al_P Ga_Q In_{1-P-Q} N$ ($0 \leq P$, $0 \leq Q$, $P+Q<1$) which is deposited on the first conductive type layer, the quantum well active layer including a pair of barrier layers and a well layer interposed therebetween; and
   a second conductive type layer made of a nitride semiconductor which is deposited on quantum well active layer,
   wherein spontaneous emission light emitted from end faces of the quantum well active layer is polarized in a direction parallel to the substrate, and
   wherein:
      the substrate is a GaN substrate;
      the first conductive type layer is deposited on a face tilted from a (0001) face of the GaN substrate by an angle equal to or greater than 0.05° and smaller than 0.2°; and
      regions of high in content and regions of low in content are provided within the active layer.

5. A display device using the semiconductor light emitting element of claim 1.

6. An optical information reproduction device using the semiconductor light emitting element of claim 1.

7. A method for fabricating the semiconductor light emitting element of claim 1, comprising a step of growing crystal grains for the well layer,
   wherein either before or after the step of growing crystal grains for the well layer, the provision of III-group material is substantially stopped for 1 to 300 seconds.

8. A semiconductor light emitting element according to claim 1, wherein the semiconductor light emitting element is a semiconductor laser element.

9. A semiconductor light emitting element according to claim 8, wherein, when a half amount of threshold current is injected, a ratio of spontaneous emission light polarized in the direction parallel to a substrate and emitted from end faces of the quantum well active layer is equal to or larger than 10.

10. A semiconductor light emitting element according to claim 3, wherein:
    an average size of the regions in which an in content is high is from larger than 5 nm up to and including 100 nm.

11. A semiconductor light emitting element according to claim 4, wherein:
    an average size of the regions in which an in content is high is from larger than 5 nm up to and including 100 nm.

12. A semiconductor light emitting element according to claim 10, wherein the semiconductor light emitting element is a semiconductor laser element.

13. A semiconductor light emitting element according to claim 12, wherein, when a half amount of threshold current is injected, a ratio of spontaneous emission light polarized in the direction parallel to the substrate and emitted from end faces of the quantum well active layer is equal to or larger than 10.

14. A semiconductor light emitting element according to claim 11, wherein the semiconductor light emitting element is a semiconductor laser element.

15. A semiconductor light emitting element according to claim 14, wherein, when a half amount of threshold current is injected, a ratio of spontaneous emission light polarized in the direction parallel to the substrate and emitted from end faces of the quantum well active layer is equal to or larger than 10.

* * * * *